(12) United States Patent
Tsukizawa et al.

(10) Patent No.: US 7,310,506 B2
(45) Date of Patent: Dec. 18, 2007

(54) DIFFERENTIAL VOLTAGE CONTROL OSCILLATOR INCLUDING RADIO-FREQUENCY SWITCHING CIRCUITS

(75) Inventors: Takayuki Tsukizawa, Neyagawa (JP); Koji Takinami, Osaka (JP); Hisashi Adachi, Mino (JP); Yukio Hiraoka, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 525 days.

(21) Appl. No.: 11/068,930

(22) Filed: Mar. 2, 2005

(65) Prior Publication Data

US 2005/0197085 A1 Sep. 8, 2005

(30) Foreign Application Priority Data

Mar. 3, 2004 (JP) ............................. 2004-059469

(51) Int. Cl.
*H04B 1/40* (2006.01)
*H04B 1/00* (2006.01)
*H04B 7/00* (2006.01)
*H03B 5/00* (2006.01)

(52) U.S. Cl. ..................................................... 455/264

(58) Field of Classification Search ................. 455/264, 455/255, 196.1, 86, 192.1–192.2, 193.2, 455/195.1, 207–208, 209, 232.1, 239.1, 236.1, 455/240.1, 257–258, 259–262, 265, 315–316, 455/318; 331/177 V, 36 C, 117 FE, 179, 331/117 D, 177 R, 16–18, 25, 36, 8

See application file for complete search history.

(56) References Cited

U.S. PATENT DOCUMENTS

| | | | |
|---|---|---|---|
| 6,452,458 B1 * | 9/2002 | Tanimoto ..................... | 331/57 |
| 6,687,488 B2 * | 2/2004 | Elder et al. .................. | 455/118 |
| 2005/0090218 A1 * | 4/2005 | Ishida et al. ................. | 455/255 |
| 2005/0242898 A1 * | 11/2005 | Anand ........................ | 331/185 |
| 2006/0022744 A1 * | 2/2006 | Wu ............................. | 327/541 |
| 2006/0103478 A1 * | 5/2006 | Brown et al. ................. | 331/57 |
| 2007/0075798 A1 * | 4/2007 | Amano ....................... | 331/167 |

FOREIGN PATENT DOCUMENTS

JP    10-242826    9/1998

OTHER PUBLICATIONS

Emad Hegazi et al., "A 17-mW Transmitter and Frequency Synthesizer for 900-MHz GSM Fully Integrated in 0.35 μm CMOS", IEEE Journal of Solid-State Circuits, vol. 38, No. 5, May 2003, pp. 782-792.

* cited by examiner

*Primary Examiner*—Pablo N. Tran
(74) *Attorney, Agent, or Firm*—Wenderoth, Lind & Ponack, L.L.P.

(57) ABSTRACT

The present invention provides a differential voltage control oscillator including: a parallel resonance circuit in which an inductor circuit, a variable capacitance circuit, and a radio-frequency switching circuit are connected in parallel together; and a negative resistance circuit connected in parallel with the parallel resonance circuit. The radio-frequency switching circuit includes: a first switching element; a first capacitive element; a second switching element; a second capacitive element; a control voltage terminal for supplying a common control voltage to the first and second switching control terminals, the control voltage terminal being connected to a virtual ground point for a differential signal generated in the parallel resonance circuit; a first radio-frequency signal reduction section connected between the control voltage terminal and the first switching element; and a second radio-frequency signal reduction section connected between the control voltage terminal and the second switching element.

21 Claims, 20 Drawing Sheets

F I G. 1
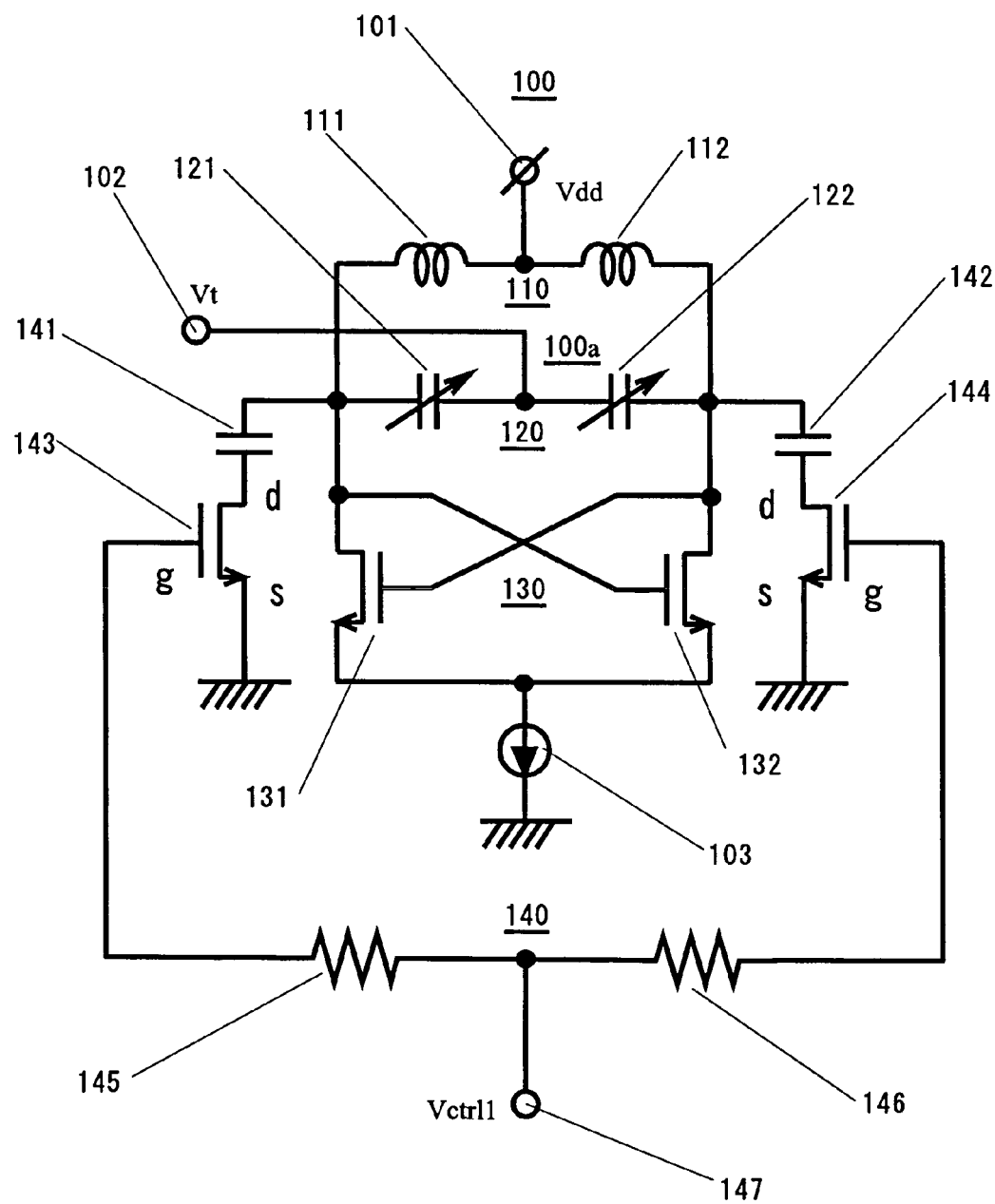

F I G. 3
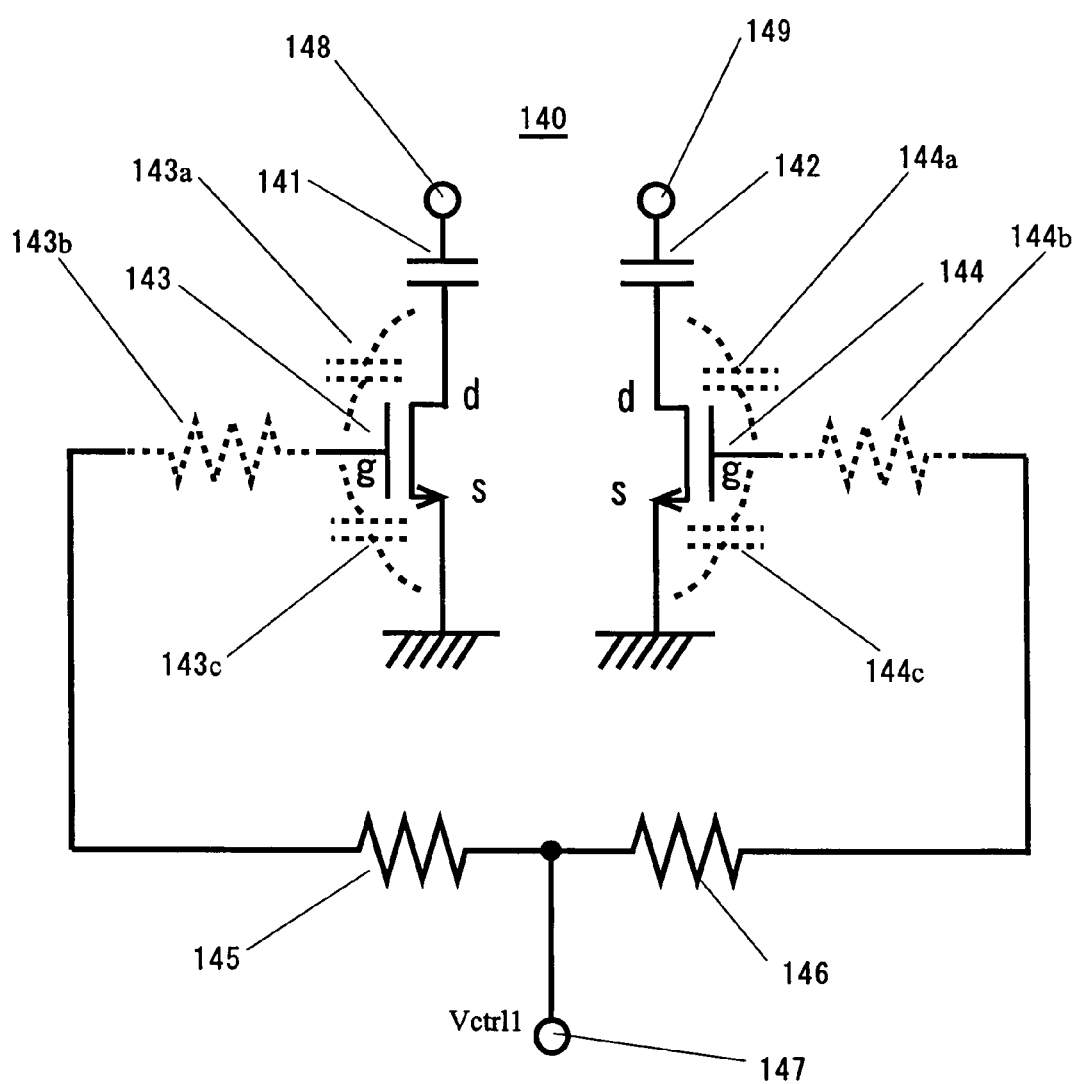

F I G. 1 9   PRIOR ART

DIFFERENTIAL VOLTAGE CONTROL OSCILLATOR INCLUDING RADIO-FREQUENCY SWITCHING CIRCUITS

BACKGROUND OF THE INVENTION

1. Field of the Invention

The present invention relates to a differential voltage control oscillator including radio-frequency switching circuits, and more particularly to a differential voltage control oscillator including radio-frequency switching circuits suitable for use in a radio communication apparatus such as a mobile telephone.

Further, the present invention relates to a matching circuit including radio-frequency switching circuits.

Furthermore, the present invention relates to a phase-locked loop (PLL) circuit including a differential voltage control oscillator. Further still, the present invention relates to a radio communication apparatus including a differential voltage control oscillator.

2. Description of the Background Art

Differential voltage control oscillators are widely used as means for generating a local signal in radio communication apparatuses such as mobile telephones. In the case of fabricating the differential voltage control oscillators as radio-frequency integrated circuits (ICs), it is necessary to set an oscillation frequency range so as to be wide with consideration that the quality of IC components may vary among them even if the IC components are fabricated in the same semiconductor fabrication process. Also, in recent years, it has become necessary to enable the oscillation frequency of the differential voltage control oscillators to vary in a wide frequency range so as to be compatible with communication systems using different frequency bands.

A known differential voltage control oscillator includes a plurality of radio-frequency switching circuits in order to enable the oscillation frequency to vary in wide range (see FIG. 11 in Emad Hegazi, et al., "Transmitter and Frequency Synthesizer for 900-MHz GSM Fully Integrated in 0.35 µm CMOS", IEEE JOURNAL OF SOLID-STATE CIRCUITS, U.S.A., VOL. 38, No. 5, May, 2003, pp. 782-792). FIG. 17 is a circuit diagram illustrating a conventional differential voltage control oscillator 600.

The differential voltage control oscillator 600 shown in FIG. 17 includes a parallel resonance circuit 100a and a negative resistance circuit 130.

The parallel resonance circuit 100a includes an inductor circuit 110, a variable capacitance circuit 120, a first radio-frequency switching circuit 640, a second radio-frequency switching circuit 650, a third radio-frequency switching circuit 660, and a fourth radio-frequency switching circuit 670. The inductor circuit 110, the variable capacitance circuit 120, the negative resistance circuit 130, the first radio-frequency switching circuit 640, the second radio-frequency switching circuit 650, the third radio-frequency switching circuit 660, and the fourth radio-frequency switching circuit 670 are connected in parallel with each other.

The inductor circuit 110 includes an inductor pair composed of an inductor 111 and an inductor 112 connected in series therewith. Connected between the inductors 111 and 112 is a power terminal 101 for supplying voltage Vdd to the differential voltage control oscillator 600.

The variable capacitance circuit 120 includes a varactor pair composed of a varactor 121 and a varactor 122 connected in series therewith. Connected between the varactors 121 and 122 is a control voltage terminal 102 for supplying control voltage Vt to control the variable capacitance circuit 120.

The negative resistance circuit 130 includes a transistor pair composed of a transistor 131 and a transistor 132. The transistor 131 has a gate connected to a drain of the transistor 132. The transistor 132 has a gate connected to a drain of the transistor 131. That is, the transistors 131 and 132 are cross-coupled with each other.

The transistor 131 has a source connected to one terminal of a current source 103. The transistor 132 has a source connected to the same terminal of the current source 103. The other terminal of the current source 103 is grounded.

The first radio-frequency switching circuit 640 includes a series circuit pair consisting of: a series circuit composed of a capacitive element 141 and a switching element 143; and a series circuit composed of a capacitive element 142 and a switching element 144. The capacitive elements 141 and 142 are metal-insulator-metal (MIM) capacitance elements.

The switching elements 143 and 144 are field-effect transistors (FETs).

The capacitive element 141 is connected at one end to a drain d (conduction terminal) of the switching element 143. The capacitive element 142 is connected at one end to a drain d (conduction terminal) of the switching element 144. The capacitive element 141 is connected at the other end to one of two connection points at which the inductor circuit 110, the variable capacitance circuit 120, and the negative resistance circuit 130 are connected together. The capacitive element 142 is connected at the other end to the other connection point at which the inductor circuit 110, the variable capacitance circuit 120, and the negative resistance circuit 130 are connected together.

The switching element 143 has a gate terminal (switching control terminal) connected to a gate terminal (switching control terminal) of the switching element 144. Both of the switching elements 143 and 144 have a source connected to ground.

The two series circuits in the series circuit pair are connected together at a connection point at which the gate terminals (switching control terminals) of the switching elements 143 and 144 are connected with each other.

A control voltage terminal 147 is connected to the connection point at which the gate terminals of the switching elements 143 and 144 are connected with each other. The control voltage terminal 147 supplies control voltage Vctrl1 to the switching elements 143 and 144.

In each of the second radio-frequency switching circuit 650, the third radio-frequency switching circuit 660, and the fourth radio-frequency switching circuit 670, the connection relationship between internal elements is the same as that in the first radio-frequency switching circuit 640. Also, control voltages Vctrl1, Vctrl2, Vctrl3, and Vctrl4, which can be independently controlled, are respectively inputted from the control voltage terminal 147, a control voltage terminal 157, a control voltage terminal 167, and a control voltage terminal 177 to the first through fourth radio-frequency switching circuits.

The parallel resonance circuit 100a resonates at a frequency which is determined by the inductance of the inductor circuit 110 and the total capacitance of the variable capacitance circuit 120 and the first through fourth radio-frequency switching circuits 640-670. The negative resistance circuit 130 is operable to compensate for the loss that is generated in the parallel resonance circuit 100a to which voltage Vdd is applied. Thus, the differential voltage control oscillator 600 oscillates at a frequency close to the resonance frequency of the parallel resonance circuit 100a.

The capacitance of the variable capacitance circuit 120 varies depending on voltages applied to two ends of each of the varactors 121 and 122. The varactors 121 and 122 each have voltage Vdd and control voltage Vt applied to the two ends. Since the control voltage Vt is variable, the control voltage Vt is changed to adjust the entire voltage applied to the varactors 121 and 122. If the entire voltage applied to the varactors 121 and 122 are changed, the capacitance of the variable capacitance circuit 120 varies, and therefore the resonance frequency of the parallel resonance circuit 100a varies.

The first radio-frequency switching circuit 640 is switched on/off by the control voltage Vctrl1. If the first radio-frequency switching circuit 640 is switched on, a channel between the drain and the source of each of the switching elements 143 and 144 becomes active and therefore conductive, so that the capacitance of the parallel resonance circuit 100a is increased compared to when the first radio-frequency switching circuit 640 is in the OFF state. As a result, the resonance frequency of the parallel resonance circuit 100a is decreased.

As such, the first radio-frequency switching circuit 640 is switched on/off to shift the oscillation frequency.

As described above, the differential voltage control oscillator 600 includes the first through fourth radio-frequency switching circuits 640-670 to which their respective independently controllable control voltages Vctrl1 through Vctrl4 are inputted.

For example, with respect to the capacitive elements and the switching elements of the first radio-frequency switching circuit 640, the capacitance of each capacitive element of the second radio-frequency switching circuit 650 and the gate width of each switching element thereof are two-fold higher, the capacitance of each capacitive element of the third radio-frequency switching circuit 660 and the gate width of each switching element thereof are four-fold higher, and the capacitance of each capacitive element of the fourth radio-frequency switching circuit 670 and the gate width of each switching element thereof are eight-fold higher.

In the above-described parallel resonance circuit, the control voltages Vctrl1 through Vctrl4 are controlled so as to selectively switch on/off the first through fourth radio-frequency switching circuits 640-670, whereby it is possible to shift the oscillation frequency range, which can be controlled by the control voltage Vt, between sixteen different ranges (2×2×2×2 different ranges). As such, by using a plurality of radio-frequency switching circuits, it becomes possible to achieve a wide frequency variable range.

FIG. 18 is a graph showing the oscillation frequency characteristic of the conventional differential voltage control oscillator 600. In the graph of FIG. 18, the horizontal axis denotes the control voltage Vt, and the vertical axis denotes the oscillation frequency. Also, in the graph, the solid line corresponding to the maximum oscillation frequency represents the case where the first through fourth radio-frequency switching circuits 640-670 are all in the OFF state. Also, in the graph, the solid line corresponding to the minimum oscillation frequency represents the case where the first through fourth radio-frequency switching circuits 640-670 are all in the ON state.

The graph contains sixteen solid lines (including the lines corresponding to the maximum and minimum oscillation frequencies) which correspond to different combinations of ON and OFF states of the first through fourth radio-frequency switching circuits 640-670.

It is understood from FIG. 18 that the oscillation frequency decreases as the control voltage Vt increases. It is also understood that the oscillation frequency range is shifted in accordance with the different combinations of ON and OFF states of the first through fourth radio-frequency switching circuits 640-670.

Thus, the conventional differential voltage control oscillator 600 including a plurality of radio-frequency switching circuits enable the oscillation frequency to vary in wide range.

Also, matching circuits including radio-frequency switching circuits similar to those as described above are known. In the matching circuits including radio-frequency switching circuits, switching elements of the radio-frequency switching circuits are switched to enable load impedances to vary, thereby providing matching for a wide frequency range.

However, the conventional differential voltage control oscillator has a disadvantage in that if the oscillation frequency is controlled to vary in wide range, the phase noise characteristic is degraded. Particularly, the phase noise characteristic when the radio-frequency switching circuits are in the OFF state is not satisfactory.

FIG. 19 is a graph showing the phase noise characteristic of the conventional differential voltage control oscillator 600. In the graph of FIG. 19, the horizontal axis denotes the control voltage Vt, and the vertical axis denotes the phase noise.

In the graph, the solid curve corresponding to the most satisfactory phase noise (at the bottom in the graph) represents the case where the first through fourth radio-frequency switching circuits 640-670 are all in the ON state. In the graph, the solid curve corresponding to the least satisfactory phase noise (at the top in the graph) represents the first through fourth radio-frequency switching circuits 640-670 are all in the OFF state. The graph contains sixteen solid curves (including the above-mentioned curves) which correspond to different combinations of ON and OFF states of the first through fourth radio-frequency switching circuits 640-670.

It is understood from FIG. 19 that the phase noise characteristic indicated by the curves is shifted in accordance with the different combinations of ON and OFF states of the first through fourth radio-frequency switching circuits 640-670. Particularly, there is a difference of about 5 dB between the cases where the first through fourth radio-frequency switching circuits 640-670 are all in the ON state and where they are all in the OFF state.

Next, in order to analyze the phase noise characteristic of the differential voltage control oscillator 600, Q-factor is used as an evaluation parameter. The "Q-factor" as described herein is an index for indicating the loss in circuit elements, and the loss in the entire circuit decreases as the Q-factor increases.

FIG. 20 is a graph showing the relationship of the Q-factor of the conventional radio-frequency switching circuit 640 to the radio-frequency signal. In the graph of FIG. 20, the horizontal axis denotes the physical gate width of the switching element 143, and the vertical axis denotes the Q-factor on a logarithmic scale. Note that the switching element 144 operates in the same manner as the switching element 143, and therefore, only the operation of the switching element 143 is described below in conjunction with the graph of FIG. 20 and the description of the operation of the switching element 144 is omitted.

In the graph of FIG. 20, the solid curve denotes the Q-factor of the first radio-frequency switching circuit 640 when the switching element 143 is in the ON state, and the dotted curve denotes the Q-factor of the first radio-frequency switching circuit 640 when the switching element 143 is in the OFF state.

FIG. 21 is a circuit diagram illustrating the conventional radio-frequency switching circuit 640 which is included in the conventional differential voltage control oscillator 600. In FIG. 21, the same elements as those shown in FIG. 17 are denoted by the same reference numerals, and reference numeral 148 denotes a terminal of the capacitive element 141 which is not connected to the switching element 143.

In FIG. 21, the dotted lines denote parasitic capacitances and a gate resistance. A parasitic capacitance 143a is a gate-drain capacitance of the switching element 143. A parasitic capacitance 143c is a gate-source capacitance of the switching element 143. Aresistance 143b is that of the switching element 143.

In FIG. 20, in the case where the switching element 143 is in the ON state (the solid curve), the Q-factor is increased with the gate width Wg of the switching element 143.

In the case where the switching element 143 is in the ON state, the switching element 143 is active and therefore conductive, so that a radio-frequency signal mostly flows through the switching element 143 from drain d to source s and further to ground. The radio-frequency signal partially leaks from drain d to gate g via the parasitic capacitance 143a but the portion of the radio-frequency signal that leaks toward the gate g is small compared to the portion of the radio-frequency signal that flows to ground.

Therefore, the Q-factor of the radio-frequency switching circuit is substantially determined by the on-resistance of the switching element 143. The on-resistance of the switching element 143 can be reduced by increasing the gate width of the switching element 143. Thus, by increasing the gate width of the switching element 143 to reduce the on-resistance, it becomes possible to increase the Q-factor of the radio-frequency switching circuit in the ON state.

On the other hand, in FIG. 20, in the case where the switching element 143 is in the OFF state (the dotted curve), even if the gate width is increased, the Q-factor of the radio-frequency switching circuit is low compared to that in the case of the ON state.

In the case where the switching element 143 is in the OFF state, i.e., power to the switching element 143 is shut off, the radio-frequency signal does not flow basically. However, a portion of the radio-frequency signal flows from drain d to gate g via the parasitic capacitance 143a. That portion of the radio-frequency signal is divided into components flowing from source s to ground via the parasitic capacitance 143c, and components flowing through the gate resistance 143b to the control voltage terminal 147.

The components of the radio-frequency signal that flow to ground pass through only the parasitic capacitance 143c, and therefore substantially no loss occurs. However, the components of the radio-frequency signal that flow through the gate resistance 143b to the control voltage terminal 147 suffers loss due to the gate resistance 143b, resulting in degradation of the Q-factor of the radio-frequency switching circuit 640.

As described above, radio-frequency switching circuits for use in conventional differential voltage control oscillators have a disadvantage in that the Q-factor in the case of the OFF state degrades compared to the Q-factor in the case of the ON state.

Also, the Q-factor of a radio-frequency switching circuit is proportional to the phase noise of a differential voltage control oscillator including that radio-frequency switching circuit, and therefore the phase noise characteristic of the differential voltage control oscillator becomes more satisfactory as the Q-factor of the radio-frequency switching circuit increases. Accordingly, the conventional differential voltage control oscillators including radio-frequency switching circuits have a disadvantage in that no satisfactory phase noise characteristic can be achieved, in particular, when a switching element of the radio-frequency switching circuit is in the OFF state.

A problem similar to the above problem occurs when a radio-frequency switching circuit constitutes a part of a matching circuit. Specifically, even in the matching circuit, the radio-frequency switching circuit has a disadvantage in that the Q-factor in the case of the OFF state degrades compared to the Q-factor in the case of the ON state. Accordingly, conventional matching circuits including a radio-frequency switching circuit have a disadvantage in that the loss in the matching circuits is considerably large, in particular, when a switching element of the radio-frequency switching circuit is in the OFF state.

SUMMARY OF THE INVENTION

Therefore, an object of the present invention is to provide a radio-frequency switching circuit with a high Q-factor. Another object of the present invention is to provide a differential voltage control oscillator with a satisfactory phase noise characteristic which allows the oscillation frequency to vary in a wide frequency range. Still another object of the present invention is to provide a low-loss matching circuit which allows load impedances to vary. Still another object of the present invention is to provide a phase-locked loop (PLL) circuit including the differential voltage control oscillator. Still another object of the present invention is to provide a radio communication apparatus including the differential voltage control oscillator.

The present invention has the following features to attain the objects mentioned above.

A first aspect of the present invention is directed to a differential voltage control oscillator for oscillating a radio-frequency signal, including: a parallel resonance circuit in which an inductor circuit, a variable capacitance circuit, and a radio-frequency switching circuit are connected in parallel together; and a negative resistance circuit connected in parallel with the parallel resonance circuit, the radio-frequency switching circuit including: a first switching element which is switched in accordance with a control voltage applied to a first switching control terminal; a first capacitive element connected to the first switching element; a second switching element which is switched in accordance with a control voltage applied to a second switching control terminal; a second capacitive element connected to the second switching element; a control voltage terminal for supplying a common control voltage to the first and second switching control terminals, the control voltage terminal being connected to a virtual ground point for a differential signal generated in the parallel resonance circuit; a first radio-frequency signal reduction section for reducing a radio-frequency signal that flows from a conduction terminal of the first switching element to the first switching control terminal, the first radio-frequency signal reduction section being connected between the control voltage terminal and the first switching element; and a second radio-frequency signal reduction section for reducing a radio-frequency signal that flows from a conduction terminal of the second switching element to the second switching control terminal, the second radio-frequency signal reduction section being connected between the control voltage terminal and the second switching element.

In the first aspect of the present invention, the differential voltage control oscillator includes the first and second radio-frequency signal reduction sections, and therefore has a high Q-factor. Accordingly, the differential voltage control oscillator has a satisfactory phase noise characteristic when the radio-frequency switching circuit is in the OFF state. Further, the differential voltage control oscillator exhibits a phase noise characteristic equal to that in the conventional art even when the radio-frequency switching circuit is in the ON state. Furthermore, the differential voltage control oscillator is able to improve the phase noise characteristic with less current consumption compared to the conventional art.

Preferably, the first radio-frequency signal reduction section acts as a first impedance element for presenting a desired impedance to the radio-frequency signal that flows from the conduction terminal of the first switching element to the first switching control terminal, and the second radio-frequency signal reduction section acts as a second impedance element for presenting a desired impedance to the radio-frequency signal that flows from the conduction terminal of the second switching element to the second switching control terminal.

In this manner, by forming radio-frequency signal reduction sections using impedance elements, it becomes possible to readily realize a differential voltage control oscillator having a satisfactory phase noise characteristic.

Preferably, the radio-frequency switching circuit further includes a third radio-frequency signal reduction section for reducing the radio-frequency signal that flows from the conduction terminal of the first switching element to the first switching control terminal and the radio-frequency signal that flows from the conduction terminal of the second switching element to the second switching control terminal, the third radio-frequency signal reduction section being connected between the virtual ground point and the control voltage terminal.

With this configuration, even if a point designed to act as a virtual ground point does not completely play the role of a virtual ground point due to the disturbance of differential balance, it is possible to substantially prevent a radio-frequency signal from flowing to the control voltage terminal. Thus, it is possible to provide a differential voltage control oscillator having a satisfactory phase noise characteristic.

Note that instead of including the second radio-frequency signal reduction section, the radio-frequency switching circuit may include a fourth radio-frequency signal reduction section connected between the control voltage terminal and the virtual ground point.

Preferably, the first and second impedance elements present impedances such that a Q-factor when the first and second switching elements are off becomes substantially equivalent to a Q-factor when the first and second switching elements are on.

With this configuration, it is possible to provide a differential voltage control oscillator having a satisfactory phase noise characteristic.

For example, at least one of the first and second impedance elements may be a resistive element. Alternatively, at least one of the first and second impedance elements is an inductor. Also, the inductor may be a wire conductor.

Preferably, the third radio-frequency signal reduction section acts as a third impedance element.

For example, the third impedance element may be a resistive element or an inductor.

Preferably, the differential voltage control oscillator may further include at least one additional radio-frequency switching circuit having the same relationship as the radio-frequency switching circuit with respect to an internal element connection, the at least one additional radio-frequency switching circuit being connected in parallel with the parallel resonance circuit and the negative resistance circuit.

In this manner, if a plurality of radio-frequency switching circuits are provided, it is possible to shift the capacitance value of the entire variable capacitance circuit in accordance with a combination of ON and OFF states of the radio-frequency switching circuits. Accordingly, the differential voltage control oscillator is able to allow the oscillation frequency to vary in a wide frequency range.

Preferably, first and second capacitive elements in any one radio-frequency switching circuit have the same element value as each other, and the element values of the first and second capacitive elements of the radio-frequency switching circuit are different from element values of first and second capacitive elements of any other radio-frequency switching circuit.

With this configuration, it is possible to maximize the number of combinations of shifting the oscillation frequency.

For example, the first switching element and second switching elements may be field-effect transistors.

Preferably, the field-effect transistors have a ring structure in which a gate electrode surrounds a drain electrode.

With this configuration, the drain-substrate parasitic capacitance can be minimized. Thus, it is possible to provide a differential voltage control oscillator having a satisfactory phase noise characteristic.

Preferably, the first and second switching elements are field-effect transistors laid out on an IC chip so as to form a comb-like configuration in which portions of the field-effect transistors alternate with each other.

With this configuration, resistance components between substrates in a radio-frequency switching circuit pair. Thus, it is possible to provide a differential voltage control oscillator having a satisfactory phase noise characteristic.

Preferably, the field-effect transistors have a gate with a lead located on a top layer of the IC chip.

With this configuration, the loss that is generated in the substrates can be reduced. Thus, it is possible to provide a differential voltage control oscillator having a satisfactory phase noise characteristic.

Preferably, the first and second radio-frequency signal reduction sections are disposed close to the lead of the gate of a corresponding one of the field-effect transistors.

With this configuration, parasitic capacitances between the leads and the substrates can be minimized, resulting in a reduction of the loss that is generated in the substrates can be reduced. Thus, it is possible to provide a differential voltage control oscillator having a satisfactory phase noise characteristic.

For example, the first and second capacitive elements may be metal-insulator-metal (MIM) capacitance elements. Alternatively, the first and second capacitive element may be metal-oxide-semiconductor (MOS) capacitance elements.

A second aspect of the present invention is directed to a matching circuit connected to a differential radio-frequency circuit which provides matching between the differential radio-frequency circuit and a further circuit connected to the differential radio-frequency circuit, the matching circuit including a radio-frequency switching circuit connected in parallel between the differential radio-frequency circuit and the further circuit, the radio-frequency switching circuit allowing a load impedance to a radio-frequency signal, which flows between the differential radio-frequency circuit and the further circuit, to become variable, the radio-frequency switching circuit including: a first switching element which is switched in accordance with a control voltage applied to a first switching control terminal; a first capacitive element connected to the first switching element; a second switching element which is switched in accordance with a control voltage applied to a second switching control terminal; a second capacitive element connected to the second switching element; a control voltage terminal for supplying a common control voltage to the first and second switching control terminals, the control voltage terminal being connected to a virtual ground point for a differential signal in the matching circuit; a first radio-frequency signal reduction section for reducing a radio-frequency signal that flows from a conduction terminal of the first switching element to the first switching control terminal, the first radio-frequency signal reduction section being connected between the control voltage terminal and the first switching element; and a second radio-frequency signal reduction section for reducing a radio-frequency signal that flows from a conduction terminal of the second switching element to the second switching control terminal, the second radio-frequency signal reduction section being connected between the control voltage terminal and the second switching element.

In the matching circuit, the first radio-frequency signal reduction section preferably acts as a first impedance element for presenting a desired impedance to the radio-frequency signal that flows from the conduction terminal of the first switching element to the first switching control terminal, and the second radio-frequency signal reduction section preferably acts as a second impedance element for presenting a desired impedance to the radio-frequency signal that flows from the conduction terminal of the second switching element to the second switching control terminal.

In the matching circuit, the radio-frequency switching circuit preferably further includes a third impedance element connected between the virtual ground point and the control voltage terminal.

Note that instead of including the second radio-frequency signal reduction section, the radio-frequency switching circuit may include a fourth radio-frequency signal reduction section connected between the control voltage terminal and the virtual ground point.

In the matching circuit, the first and second impedance elements preferably present impedances such that a Q-factor when the first and second switching elements are off becomes substantially equivalent to a Q-factor when the first and second switching elements are on.

In the matching circuit, at least one of the first and second impedance elements may be a resistive element, for example.

In the matching circuit, at least one of the first and second impedance elements may be an inductor, for example.

In the matching circuit, the inductor may be a wire conductor, for example.

In the matching circuit, the third impedance element may be a resistive element, for example.

In the matching circuit, the third impedance element may be an inductor, for example.

Preferably, the matching circuit further includes at least one additional radio-frequency switching circuit having the same relationship as the radio-frequency switching circuit with respect to an internal element connection, the at least one additional radio-frequency switching circuit being connected in parallel with the parallel resonance circuit and the negative resistance circuit.

Preferably, in the matching circuit, first and second capacitive elements in any one radio-frequency switching circuit have the same element value as each other, and the element values of the first and second capacitive elements of the radio-frequency switching circuit are different from element values of first and second capacitive elements of any other radio-frequency switching circuit.

Preferably, in the matching circuit, the first switching element and second switching elements are field-effect transistors.

Preferably, in the matching circuit, the field-effect transistors have a ring structure in which a gate electrode surrounds a drain electrode.

Preferably, in the matching circuit, the first and second switching elements are field-effect transistors laid out on an IC chip so as to form a comb-like configuration in which portions of the field-effect transistors alternate with each other.

Preferably, in the matching circuit, the field-effect transistors have a gate with a lead located on a top layer of the IC chip.

Preferably, in the matching circuit, the first and second radio-frequency signal reduction sections are disposed close to the lead of the gate of a corresponding one of the field-effect transistors.

In the matching circuit, the first and second capacitive elements may be metal-insulator-metal (MIM) capacitance elements, for example.

In the matching circuit, the first and second capacitive elements may be metal-oxide-semiconductor (MOS) capacitance elements, for example.

Preferably, the matching circuit further includes: a fourth impedance element connected to one of two input/output terminals of the differential radio-frequency circuit; and a fifth impedance element connected to the other input/output terminal of the differential radio-frequency circuit.

In the matching circuit, at least one of the fourth and fifth impedance elements may be an inductor, for example.

In the matching circuit, at least one of the fourth and fifth impedance elements maybe a capacitive element, for example.

Preferably, the matching circuit may include a sixth impedance element disposed on a circuit connected in parallel with the radio-frequency switching circuit.

In the matching circuit, the sixth impedance element may be an inductor or a capacitive element, for example.

A third aspect of the present invention is directed to a phase-locked loop (PLL) circuit including a differential voltage control oscillator which is configured in a manner similar to the differential voltage control oscillator as described above.

A fourth aspect of the present invention is directed to a wireless communication apparatus including a differential voltage control oscillator which is configured in a manner similar to the differential voltage control oscillator as described above.

As described above, according to the present invention, it is possible to provide a differential voltage control oscillator having a satisfactory phase noise characteristic which allows the oscillation frequency to vary in a wide frequency range. Further, according to the present invention, it is possible to provide a low-loss matching circuit which allows the load impedance to vary. Furthermore, it is possible to provide a PLL circuit and a wireless communication terminal apparatus, which advantageously include the differential voltage control oscillator of the present invention.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram illustrating a differential voltage control oscillator including a radio-frequency switching circuit according to a first embodiment of the present invention;

FIG. 3 is a circuit diagram illustrating the radio-frequency switching circuit according to the first embodiment;

DESCRIPTION OF THE PREFERRED EMBODIMENTS

First Embodiment

Figure 2:
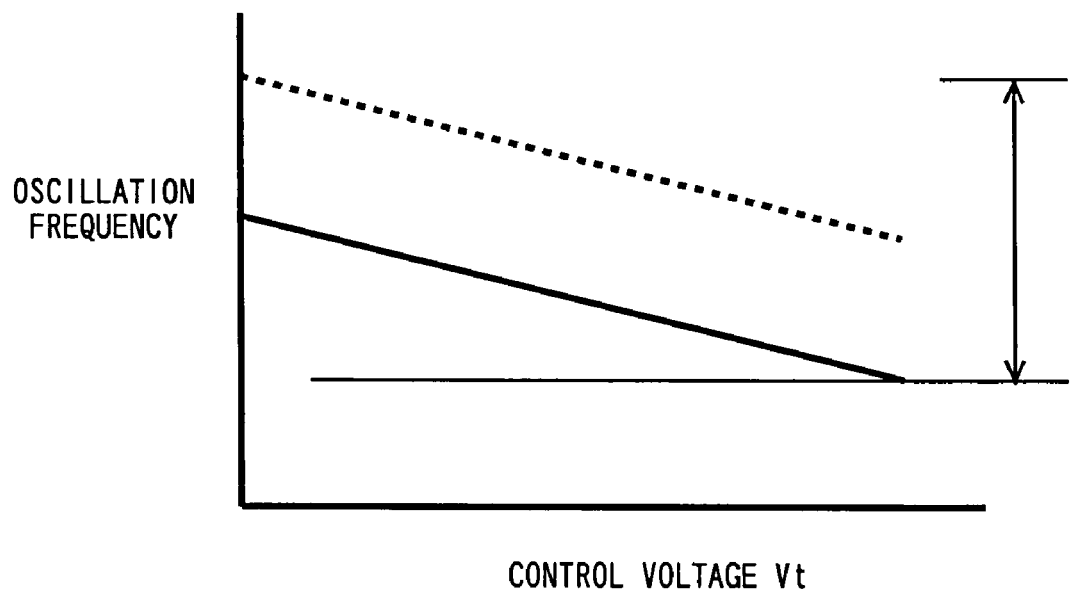
FIG. 2 is a graph schematically showing the frequency characteristic of the differential voltage control oscillator including the radio-frequency switching circuit according to the first embodiment.

FIG. 1 is a circuit diagram illustrating a differential voltage control oscillator 100 including a radio-frequency switching circuit 140 according to a first embodiment of the present invention. Note that the differential voltage control oscillator 100 is suitable for use in a frequency band between 800 MHz and 5 GHz where mobile telephones operate under the global system for mobile communications (GSM) technology or the personal digital cellular (PDC) technology.

The differential voltage control oscillator 100 shown in FIG. 1 includes a parallel resonance circuit 100a and a negative resistance circuit 130.

The parallel resonance circuit 100a includes an inductor circuit 110, a variable capacitance circuit 120, and a radio-frequency switching circuit 140. In the differential voltage control oscillator 100, the inductor circuit 110, the variable capacitance circuit 120, the negative resistance circuit 130, and the radio-frequency switching circuit 140 are connected in parallel with each other.

The inductor circuit 110 includes a differential inductor pair composed of an inductor 111 and an inductor 112 connected in series therewith. The inductors 111 and 112 are equivalent in element value to each other. A power terminal 101 for supplying voltage Vdd to the differential voltage control oscillator 100 is connected between the inductors 111 and 112 at a virtual ground point for a differential signal generated in the parallel resonance circuit 100a.

The variable capacitance circuit 120 includes a differential varactor pair composed of a varactor 121 and a varactor 122 connected in series therewith. The varactors 121 and 122 are equivalent in element value to each other. A control voltage terminal 102 for supplying control voltage Vt to control the variable capacitance circuit 120 is connected between the varactors 121 and 122 at a virtual ground point for a differential signal generated in the parallel resonance circuit 100a.

The negative resistance circuit 130 includes a differential transistor pair composed of a transistor 131 and a transistor 132. The transistors 131 and 132 are equivalent in element value to each other. The transistor 131 has a gate connected to a drain of the transistor 132. The transistor 132 has a gate connected to a drain of the transistor 131. That is, the transistors 131 and 132 are cross-coupled with each other.

The transistor 131 has a source connected to one terminal of the current source 103. The transistor 132 has a source connected to the same terminal of the current source 103.

The other terminal of the current source 103 is grounded. The current source 103 is connected to a virtual ground point for a differential signal generated in the parallel resonance circuit 100a.

The radio-frequency switching circuit 140 includes a differential series circuit pair consisting of: a series circuit composed of a capacitive element 141, a switching element 143, and a resistive element 145; and a series circuit composed of a capacitive element 142, a switching element 144, and a resistive element 146. The capacitive elements 141 and 142 are equivalent in element value to each other. The switching elements 143 and 144 are equivalent in element value to each other. The resistive elements 145 and 146 are equivalent in element value to each other.

The capacitive elements 141 and 142 are metal-insulator-metal (MIM) capacitance elements. Also, the switching elements 143 and 144 are field-effect transistors. The switching elements 143 and 144 include drain d, gate g, and source s.

The capacitive element 141 is connected at one end to the drain d (conduction terminal) of the switching element 143. The capacitive element 142 is connected at one end to the drain d (conduction terminal) of the switching element 144. The other end of the capacitive element 141 is connected to one of two connection points at which the inductor circuit 110, the variable capacitance circuit 120, and the negative resistance circuit 130 are connected together. The other end of the capacitive element 142 is connected to the other connection point of the inductor circuit 110, the variable capacitance circuit 120, and the negative resistance circuit 130.

The gate g (switching control terminal) of the switching element 143 is connected to one end of the resistive element 145. The gate g (switching control terminal) of the switching element 144 is connected to one end of the resistive element 146. The source s of the switching elements 143 and 144 are grounded.

The resistive element 145 is connected at the other end to an end of the resistive element 146 that is opposite to the end connected to the switching element 144. The two series circuits in the series circuit pair are connected together at a connection point at which the resistive elements 145 and 146 are connected with each other.

A control voltage terminal 147 is connected to the connection point of the resistive elements 145 and 146. The connection point of the resistive elements 145 and 146 is a virtual ground point for a differential signal generated in the parallel resonance circuit 100a. Through the control voltage terminal 147, control voltage Vctrl1 is supplied to the switching elements 143 and 144.

With the above configuration, the parallel resonance circuit 100a resonates at a frequency which is determined by the inductance of the inductor circuit 110, the capacitance of the variable capacitance circuit 120, and the capacitance of the radio-frequency switching circuit 140. Also, the negative resistance circuit 130 is operable to compensate for the loss that is generated in the parallel resonance circuit 100a receiving voltage Vdd. Thus, the differential voltage control oscillator 100 oscillates at a frequency close to the resonance frequency of the parallel resonance circuit 100a.

The capacitance of the variable capacitance circuit 120 varies depending on voltages applied to two ends of each of the varactors 121 and 122. The varactors 121 and 122 each have voltage Vdd and control voltage Vt applied to the two ends. Since the control voltage Vt is variable, the control voltage Vt is changed to adjust the entire voltage applied to the varactors 121 and 122. If the entire voltage applied to the varactors 121 and 122 are changed, the capacitance of the variable capacitance circuit 120 varies, and therefore the resonance frequency of the parallel resonance circuit 100a varies.

The radio-frequency switching circuit 140 is switched on/off by the control voltage Vctrl1. If the radio-frequency switching circuit 140 is switched on, a channel between the drain and the source of each of the switching elements 143 and 144 becomes active and therefore conductive, so that the capacitance of the parallel resonance circuit 100a is increased compared to when the radio-frequency switching circuit 140 is in the OFF state. As a result, the resonance frequency of the parallel resonance circuit 100a is decreased.

As such, the radio-frequency switching circuit 140 is switched on/off to shift the oscillation frequency. The shift of the oscillation frequency is schematically described with reference to FIG. 2.

FIG. 2 is a graph schematically showing the frequency characteristic of the differential voltage control oscillator 100 including the radio-frequency switching circuit 140 according to the first embodiment.

In FIG. 2, the horizontal axis denotes the control voltage Vt, and the vertical axis denotes the oscillation frequency. In FIG. 2, the solid line represents an oscillation frequency characteristic when the switching elements 143 and 144 are in the ON state, and the dotted line represents an oscillation frequency characteristic when the switching elements 143 and 144 are in the OFF state.

If the control voltage Vctrl is controlled to bring the switching elements 143 and 144 to the OFF state, power to the switching elements 143 and 144 is shut off. Accordingly, the capacitance of the parallel resonance circuit 100a, which is a factor of determining the oscillation frequency, is determined by the varactors 121 and 122 of the variable capacitance circuit 120. In this state, if the control voltage Vt is changed, the capacitance of each of the varactors 121 and 122 varies. Thus, the oscillation frequency of the differential voltage control oscillator 100 is changed by the control voltage Vt.

On the other hand, if the control voltage Vctrl is controlled to bring the switching elements 143 and 144 to the ON state, the switching elements 143 and 144 become active and therefore conductive. Accordingly, the capacitance of the parallel resonance circuit 100a, which is a factor of determining the oscillation frequency, is determined by the varactors 121 and 122 of the variable capacitance circuit 120 and the capacitive elements 141 and 142. In comparison with the case of the OFF state, the capacitance of the parallel resonance circuit 100a is increased, while the oscillation frequency of the parallel resonance circuit 100a is decreased.

As such, the oscillation frequency of the differential voltage control oscillator 100 can be changed by changing the control voltage Vt. Also, the oscillation frequency of the differential voltage control oscillator 100 can be shifted by controlling the control voltage Vctrl so as to switch the state of the switching elements 143 and 144.

FIG. 3 is a circuit diagram illustrating the radio-frequency switching circuit 140 according to the first embodiment. In FIG. 3, the same elements as those shown in FIG. 1 are denoted by the same reference numerals, and the descriptions thereof are omitted. In FIG. 3, a terminal 148 is connected to a connection point at which the inductor circuit 110 and the variable capacitance circuit 120, which are shown in FIG. 1, are connected together. A terminal 149 is connected to another connection point at which the inductor circuit 110 and the variable capacitance circuit 120, which are shown in FIG. 1, are connected together.

Note that a parasitic capacitance 144a corresponds to the gate-drain capacitance of the switching element 144. A parasitic capacitance 144c corresponds to the gate-source capacitance of the switching element 144. A resistance 144b corresponds to the gate resistance of the switching element 144.

Figure 4:
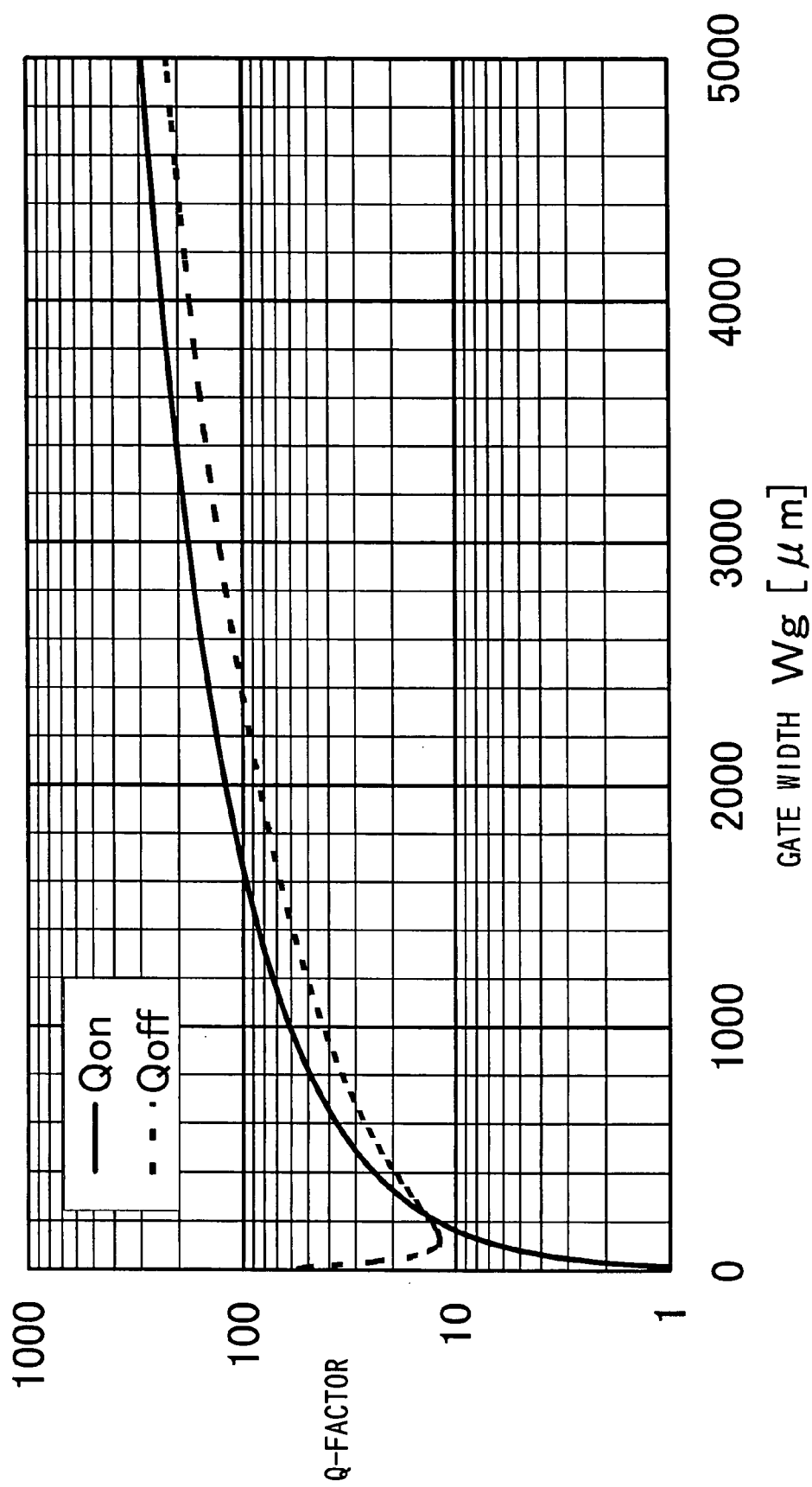
FIG. 4 is a graph showing the relationship of the Q-factor to the gate width of the switching element of the radio-frequency switching circuit according to the first embodiment.

FIG. 4 is a graph showing the relationship of the Q-factor to the gate width of the switching elements 143 and 144 of the radio-frequency switching circuit 140 according to the first embodiment. In the graph of FIG. 4, the horizontal axis denotes the physical gate width of the switching elements 143 and 144, and the vertical axis denotes the Q-factor on a logarithmic scale.

In the graph of FIG. 4, the solid curve denotes the Q-factor of the radio-frequency switching circuit 140 when the switching elements 143 and 144 are in the ON state, and the dotted curve denotes the Q-factor of the radio-frequency switching circuit 140 when the switching elements 143 and 144 are in the OFF state. Note that the resistive elements 145 and 146 each exhibit a 1 kilo-ohm ($\Omega$) resistance.

In FIG. 4, in the case where the switching elements 143 and 144 are in the ON state (the solid curve), the Q-factor increases with the gate width Wg of the switching elements 143 and 144.

In the case where the switching elements 143 and 144 are in the ON state, the switching elements 143 and 144 is active and therefore conductive, so that a radio-frequency signal mostly flows through the switching elements 143 and 144 from drain d to source s and further to ground. The radio-frequency signal partially leaks through the parasitic capacitances 143a and 144a from drain d to gate g, but the portion of the radio-frequency signal that leaks toward the gate g is small compared to the portion of the radio-frequency signal that flows to ground.

Accordingly, the Q-factor of the radio-frequency switching circuit 140 is substantially determined by the on-resistance of the switching elements 143 and 144. The on-resistance of the switching elements 143 and 144 can be reduced by increasing the gate width of the switching elements 143 and 144. Accordingly, by increasing the gate width of the switching elements 143 and 144 to reduce the on-resistance, it is possible to increase the Q-factor when the radio-frequency switching circuit 140 is in the ON state.

On the other hand, in the case where the switching elements 143 and 144 in the OFF state (the dotted curve), the Q-factor of the radio-frequency switching circuit 140 is substantially the same as that in the case of the ON state.

In the radio-frequency switching circuit 140 according to the first embodiment, the resistive element 145 is connected between the switching element 143 and the control voltage terminal 147, and the resistive element 146 is connected between the switching element 144 and the control voltage terminal 147. In this configuration, the radio-frequency signal is suppressed from leaking from drain d through gate g to the control voltage terminal 147, thereby preventing the Q-factor from degrading due to the loss in the gate resistances 143b and 144b. Thus, the Q-factor of the radio-frequency switching circuit 140 when the switching elements 143 and 144 in the OFF state becomes substantially the same as that in the case of the ON state.

Specifically, in the radio-frequency switching circuit 140 according to the first embodiment, the resistive elements 145 and 146 are each disposed inside a virtual ground point, i.e., they lie between the virtual ground point and gate g (switching control terminal), and therefore it is possible to reduce the amount of signal that flows from gate g through the gate resistance 143b or 144b to the control voltage terminal 147, which is the virtual ground point.

Further, in the radio-frequency switching circuit 140 according to the first embodiment, the resistance values of the resistive elements 145 and 146 are increased to reduce the amount of the radio-frequency signal that leaks from drain d to gate g and flows to the control voltage terminal 147. In the case where the resistance values of the resistive elements 145 and 146 are increased, the impedance presented to the radio-frequency signal at the control voltage terminal 147 is higher than the impedances presented to the radio-frequency signal at gates g (switching control terminals). Accordingly, the amount of the radio-frequency signal that leaks through the parasitic capacitances 143a and 144a from drain d to gate g and flows to the control voltage terminal 147 is reduced, and therefore the Q-factor is prevented from degrading due to the loss in the gate resistances 143b and 144b.

As such, the resistive elements 145 and 146 substantially prevent the radio-frequency signal from flowing from gates g (switching control terminals) to the control voltage terminal 147. The reduction of the amount of the radio-frequency signal that leaks from drain d (conduction terminal) to gate g (switching control terminal) and flows to the control voltage terminal 147 means that the amount of the radio-frequency signal that flows from drain d (conduction terminal) to gate g (switching control terminal) is reduced. Accordingly, the resistive element 145 acts as a first radio-frequency signal reduction section for reducing the radio-frequency signal that flows through the switching element 143 from drain d (conduction terminal) to gate g (switching control terminal). The resistive element 146 acts as a second radio-frequency signal reduction section for reducing the radio-frequency signal that flows through the switching element 144 from drain d (conduction terminal) to gate g (switching control terminal).

Since the resistive elements 145 and 146 are interposed such that the radio-frequency signal does not substantially flow from gates g (switching control terminals) to the control voltage terminal 147, radio-frequency signals are substantially isolated between the gates g (switching control terminal) of the switching elements 143 and 144.

As such, by connecting the resistive elements 145 and 146 between the gates g (switching control terminals) of the switching elements 143 and 144 and disposing the control voltage terminal 147 at the connection point of the resistive elements 145 and 146, it becomes possible to provide radio-frequency isolation between the gates g of the switching elements 143 and 144, thereby substantially preventing the radio-frequency signal from flowing from the gates g (switching control terminals) to the control voltage terminal 147.

Figure 5:
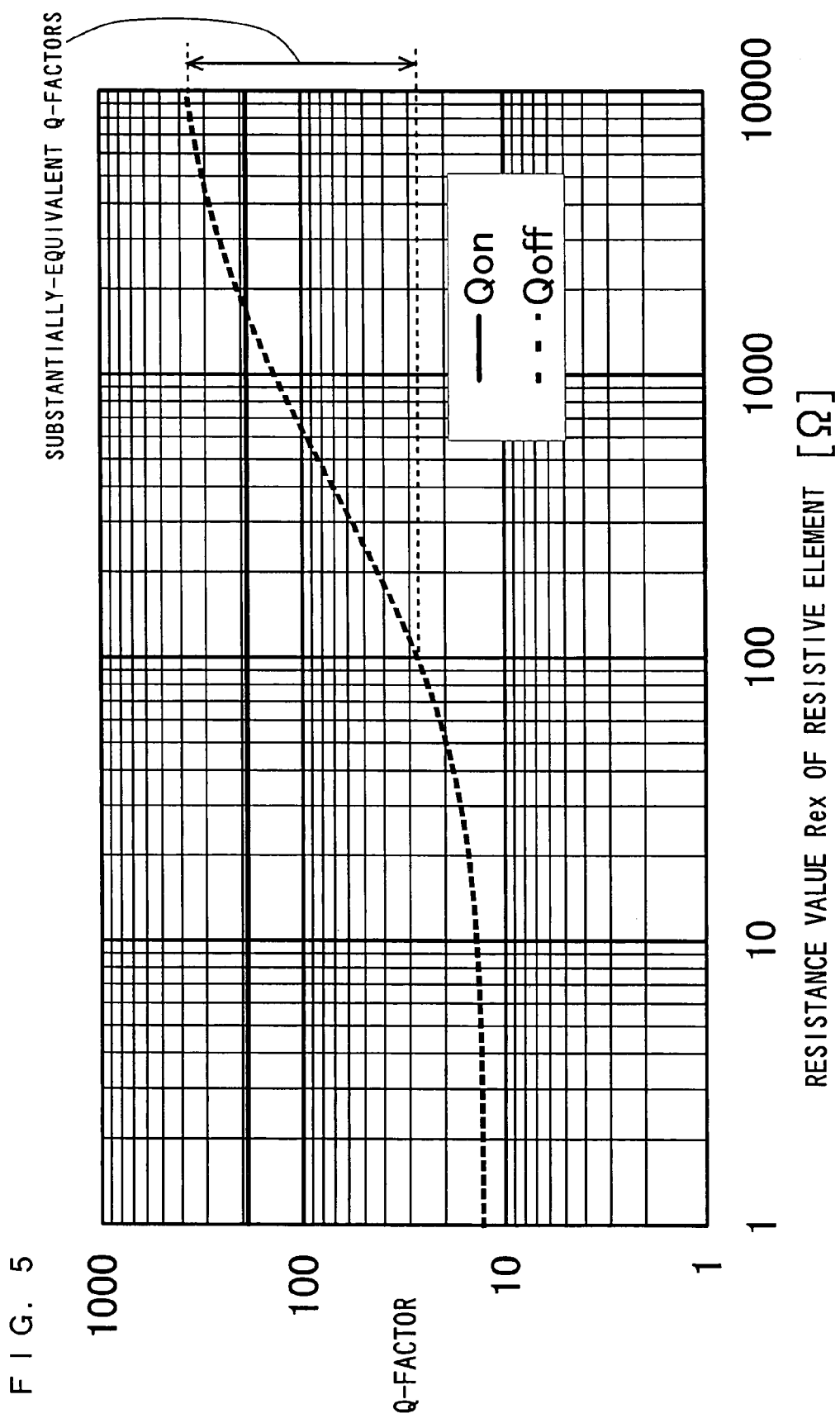
FIG. 5 is a graph showing the relationship of the Q-factor to the resistance value of a resistive element of the radio-frequency switching circuit according to the first embodiment.

FIG. 5 is a graph showing the relationship of the Q-factor to the resistance value of a resistive element of the radio-frequency switching circuit 140 according to the first embodiment. The Q-factor in the graph of FIG. 5 is plotted by changing the resistance values of the resistive elements 145 and 146 under the condition that the gate width Wg of each of the switching elements 143 and 144 is 3100 μm.

In the graph of FIG. 5, the horizontal axis denotes resistance value Rex of the resistive elements 145 and 146, and the vertical axis denotes the Q-factor. Also, the solid line denotes the Q-factor when the switching elements 143 and 144 are in the ON state, and the dotted curve denotes the Q-factor when the switching elements 143 and 144 are in the OFF state.

In FIG. 5, in the case where the switching elements 143 and 144 are in the ON state, the Q-factor is constant regardless of the resistance values of the resistive elements 145 and 146 (see the solid line).

On the other hand, in the case where the switching elements 143 and 144 are in the OFF state, the Q-factor of the radio-frequency switching circuit 140 increases with the resistance values of the resistive elements 145 and 146.

Accordingly, as the resistance values are increased, the Q-factor when the switching elements 143 and 144 are in the OFF state is increased. As is apparent from FIG. 5, if the resistance value Rex of the resistive elements 145 and 146 is set so as to be in the range between 100 Ω and 10000 Ω (10 kΩ), it is possible to obtain Q-factors which are substantially equivalent to the Q-factor when the switching elements 143 and 144 are in the ON state. The substantially-equivalent Q-factors as described herein refers to Q-factors which are substantially in the range between one tenth and twice the Q-factor in the case of the ON state. In the case where the resistance value Rex is in the range between 100 Ω and 10 kΩ, the amount of reduced phase noise is in the range between 1 dB and 2.5 dB. This does not meant that the maximum possible reduction in the amount of phase noise is achieved in the case of 10 kΩ, but the reduction amount of 2.5 dB is the highest in the case where the resistance value Rex is in the range between 100 Ω and 10 kΩ.

By interposing resistive elements having a resistance value in this range, it becomes possible to reduce the amount of the radio-frequency signal that flows through the parasitic capacitances 143a and 144a from drain d to gate g.

As described above, the radio-frequency switching circuit 140 according to the first embodiment includes the first and second radio-frequency signal reduction sections which reduce the amount of the radio-frequency signal that flows through the switching elements 143 and 144 from their drain terminals (conduction terminals) to their gate terminals (switching control terminals). Thus, the Q-factor for a radio-frequency signal when the switching elements 143 and 144 are in the OFF state is high.

Figure 6:
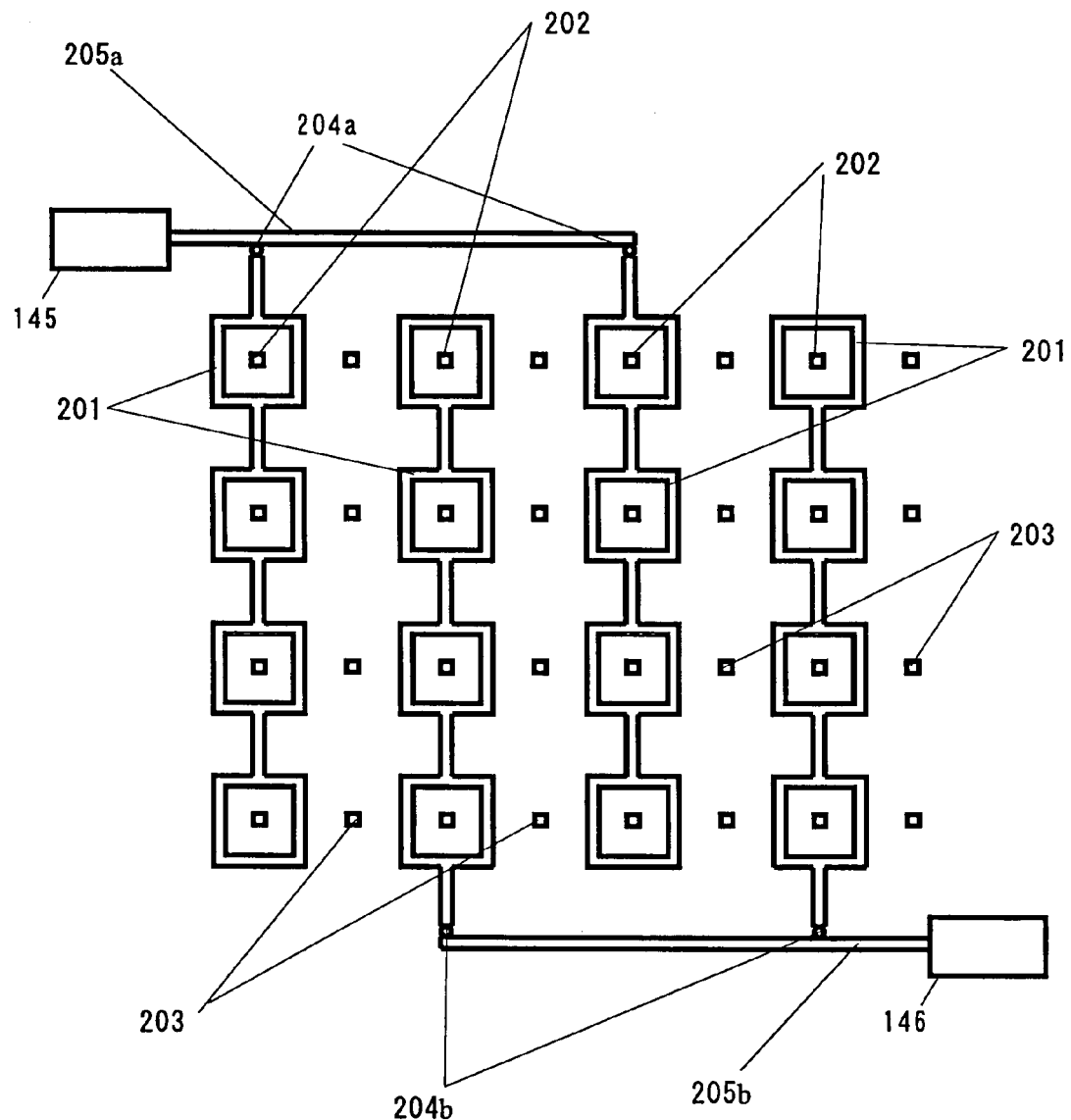
FIG. 6 is a schematic diagram of the radio-frequency switching circuit according to the first embodiment which is embodied on an IC chip.

FIG. 6 is a schematic diagram of the radio-frequency switching circuit 140 according to the first embodiment which is embodied on an IC chip. In the layout shown in FIG. 6, portions of the radio-frequency switching circuit 140 that correspond to the switching elements 143 and 144, which are field-effect transistors, are embodied on the IC chip.

Among all components of the switching elements, only gate electrodes 201, drain electrodes 202, and source electrodes 203 are shown in FIG. 6. The switching elements are in the form of a ring structure where the gate electrodes 201 surround their respective drain electrodes 202 formed in its center. Elements having such a structure are called "Ring-MOS transistors". By structuring the switching elements in the form of RingMOS transistors, it becomes possible to reduce drain-substrate parasitic capacitances.

Also, in the layout shown in FIG. 6, the gate electrodes 201 are grouped into units, each being composed of four gate electrodes 201 and connected to a gate lead 205a or 205b via a gate contact 204a or 204b. Although FIG. 6 shows an example where each unit is composed of four gate electrodes, the number of gate electrodes constituting a unit is not limited so long as a plurality of gate electrodes 201 are connected to the unit. Specifically, the first and second switching elements are laid out in a comb-like configuration, so as to alternate with each other on the IC, by connecting a plurality of units, each being composed of a plurality of RingMOS transistors including a plurality of gate electrodes 201, to the gate contact 204a or 204b via the gate lead line 205a or 205b.

In the comb-like configuration shown in FIG. 6, adjacent units are connected to different gate leads. Specifically, in FIG. 6, the leftmost unit and the third unit from the left are connected to the gate lead 205a shown on the top, and the rightmost unit and the third unit from the right are connected to the gate lead 205b shown on the bottom. As such, by disposing field-effect transistors on an IC chip in a comb-like configuration, it becomes possible to reduce resistance components between substrates in radio-frequency switching circuit pairs.

Note that in the layout of FIG. 6, structures connected together by their common gate lead collectively constitute one switching element. In the example of FIG. 6, a plurality of units connected to the gate lead 205a shown on the top constitute the switching element 143, and a plurality of units connected to the gate lead line 205b shown on the bottom constitute the switching element 144.

As shown in FIG. 6, the resistive element 145 is disposed at one end of the upper lead, and the resistive element 146 is disposed at one end of the lower lead. By disposing the resistive elements close to leads, it becomes possible to minimize parasitic capacitances between the leads and a substrate, thereby reducing the loss that is generated in the substrate.

The IC chip has a multilayer structure. Preferably, the leads may be disposed on the top layer of the IC chip, so as to further reduce the parasitic capacitances between the leads and the substrate, thereby further reducing the loss that is generated in the substrate.

The drain electrodes 202 are each connected via a lead (not shown) to the capacitive elements 141 and 142 formed in a portion of the IC that is different from the portion in which the drain electrodes 202 are formed. Also, the source electrodes 203 are each grounded via a lead (not shown).

As described above, the units each including a plurality of gate electrodes are arranged in a comb-like structure, and therefore it is possible to substantially form each element in the form of a square. By arranging the units in the form of a square or in a square-like form, it becomes possible to readily arrange elements on the IC chip.

Figure 7:
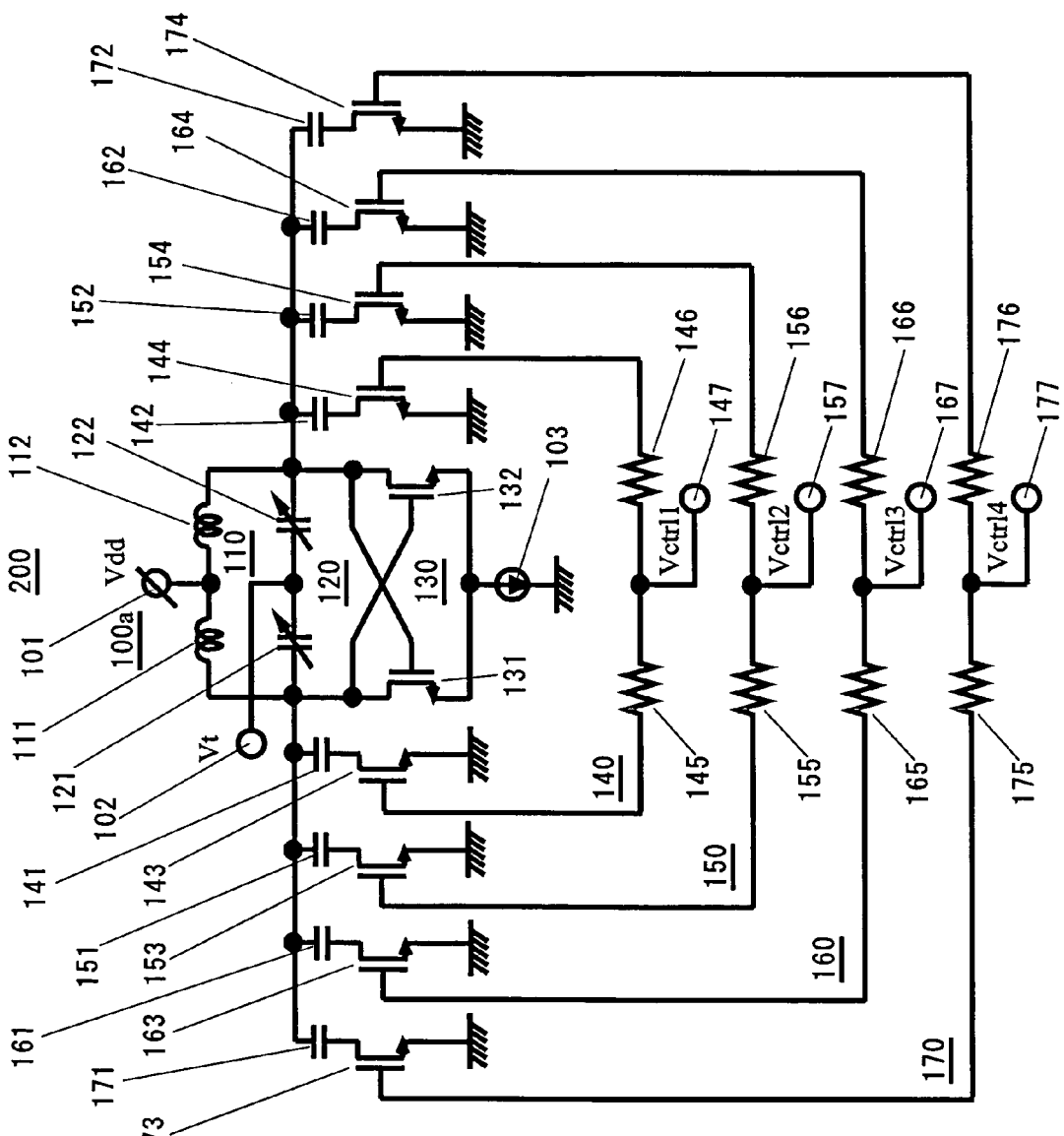
FIG. 7 is a circuit diagram illustrating a differential voltage control oscillator including a plurality of radio-frequency switching circuits according to the first embodiment.

FIG. 7 is a circuit diagram illustrating a differential voltage control oscillator including a plurality of radio-frequency switching circuits 140 according to the first embodiment. In FIG. 7, elements similar to those of the differential voltage control oscillator 100 shown in FIG. 1 are denoted by the same reference numerals, and the descriptions thereof are omitted.

A first radio-frequency switching circuit 140 shown in FIG. 7 is the same as the above-described radio-frequency switching circuit 140. In the first radio-frequency switching circuit 140, capacitive elements 141 and 142 each have capacitance value C1. Also, switching elements 143 and 144 each have gate width Wg1.

In a second radio-frequency switching circuit 150, the connection relationship between internal elements is the same as that in the first radio-frequency switching circuit 140. In the second radio-frequency switching circuit 150, capacitive elements 151 and 152 correspond to the capacitive elements 141 and 142, respectively, of the first radio-frequency switching circuit 140. Also, switching elements 153 and 154 correspond to the switching elements 143 and 144, respectively, of the first radio-frequency switching circuit 140.

Also, resistive elements 155 and 156 correspond to the resistive elements 145 and 146, respectively, of the first radio-frequency switching circuit 140. In the second radio-frequency switching circuit 150, a control voltage terminal 157 is connected to a connection point of the resistive elements 155 and 156 (a virtual ground point for a differential signal generated in the parallel resonance circuit 100a). Through the control voltage terminal 157, control voltage Vctr12 is supplied to the switching elements 153 and 154.

It is assumed that in the second radio-frequency switching circuit 150, the capacitive elements 151 and 152 each have a capacitance value of 2×C1 (two-fold of C1). The capacitive elements 151 and 152 have the same element value as each other. Also, it is assumed that the switching elements 153 and 154 each have a gate width of 2×Wg1 (two-fold of Wg1). The switching elements 153 and 154 have the same element value as each other.

In a third radio-frequency switching circuit 160, the connection relationship between internal elements is the same as that in the first radio-frequency switching circuit 140. In the third radio-frequency switching circuit 160, capacitive elements 161 and 162 correspond to the capacitive elements 141 and 142, respectively, of the first radio-frequency switching circuit 140. Also, switching elements 163 and 164 correspond to the switching elements 143 and 144, respectively, of the first radio-frequency switching circuit 140.

Also, resistive elements 165 and 166 correspond to the resistive elements 145 and 146, respectively, of the first radio-frequency switching circuit 140. In the third radio-frequency switching circuit 160, a control voltage terminal 167 is connected to a connection point of the resistive elements 165 and 166 (a virtual ground point for a differential signal generated in the parallel resonance circuit 100a). Through the control voltage terminal 167, control voltage Vctr13 is supplied to the switching elements 163 and 164.

It is assumed that in the third radio-frequency switching circuit 160, the capacitive elements 161 and 162 each have a capacitance value of 4×C1 (four-fold of C1). The capacitive elements 161 and 162 have the same element value as each other. Also, it is assumed that the switching elements 163 and 164 each have a gate width of 4×Wg1 (four-fold of Wg1). The switching elements 163 and 164 have the same element value as each other.

In a fourth radio-frequency switching circuit 170, the connection relationship between internal elements is the same as that in the first radio-frequency switching circuit 140. In the fourth radio-frequency switching circuit 170, capacitive elements 171 and 172 correspond to the capacitive elements 141 and 142, respectively, of the first radio-frequency switching circuit 140. Also, switching elements 173 and 174 correspond to the switching elements 143 and 144, respectively, of the first radio-frequency switching circuit 140.

Also, resistive elements 175 and 176 correspond to the resistive elements 145 and 146, respectively, of the first radio-frequency switching circuit 140. In the fourth radio-frequency switching circuit 170, a control voltage terminal 177 is connected to a connection point of the resistive elements 175 and 176 (a virtual ground point for a differential signal generated in the parallel resonance circuit 100a). Through the control voltage terminal 177, control voltage Vctr14 is supplied to the switching elements 173 and 174.

It is assumed that in the fourth radio-frequency switching circuit 170, the capacitive elements 171 and 172 each have a capacitance value of 8×C1 (eight-fold of C1). The capacitive elements 171 and 172 have the same element value as each other. Also, it is assumed that the switching elements 173 and 174 each have a gate width of 8×Wg1 (eight-fold of Wg1). The switching elements 173 and 174 have the same element value as each other.

A differential voltage control oscillator 200 configured as described above operates in a manner similar to the differential voltage control oscillator 100. However, the differential voltage control oscillator 200 differs from the differential voltage control oscillator 100 in that when the capacitance of the parallel resonance circuit 100a is determined, the variable range of the capacitance can be set wider depending on a combination of ON and OFF states of the first through fourth radio-frequency switching circuit 640-670.

Specifically, the first through fourth radio-frequency switching circuits 640-670 differ from each other in terms of the capacitance of capacitive elements and the gate width of switching elements, and therefore sixteen (2×2×2×2) combinations of switching is possible for the radio-frequency switching circuits. Accordingly, the oscillation frequency can be switched between sixteen different ranges. Thus, by differentiating any one of the first through fourth radio-frequency switching circuits 640-670 from the rest of the radio-frequency switching circuits in terms of the entire capacitance value, it becomes possible to shift the oscillation frequency to the greatest extent possible.

Figure 17:
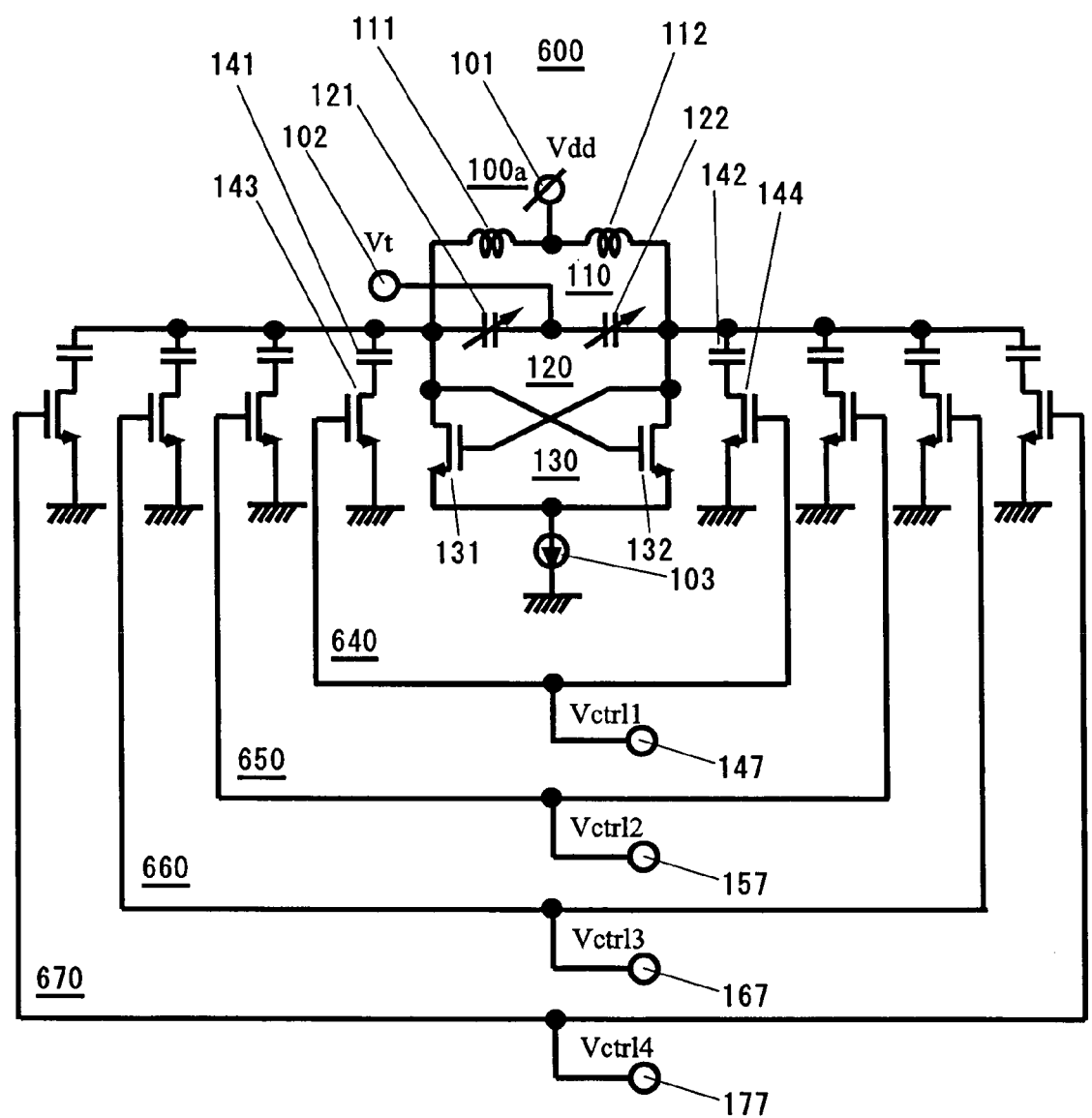
FIG. 17 is a circuit diagram illustrating a conventional differential voltage control oscillator.
Figure 18:
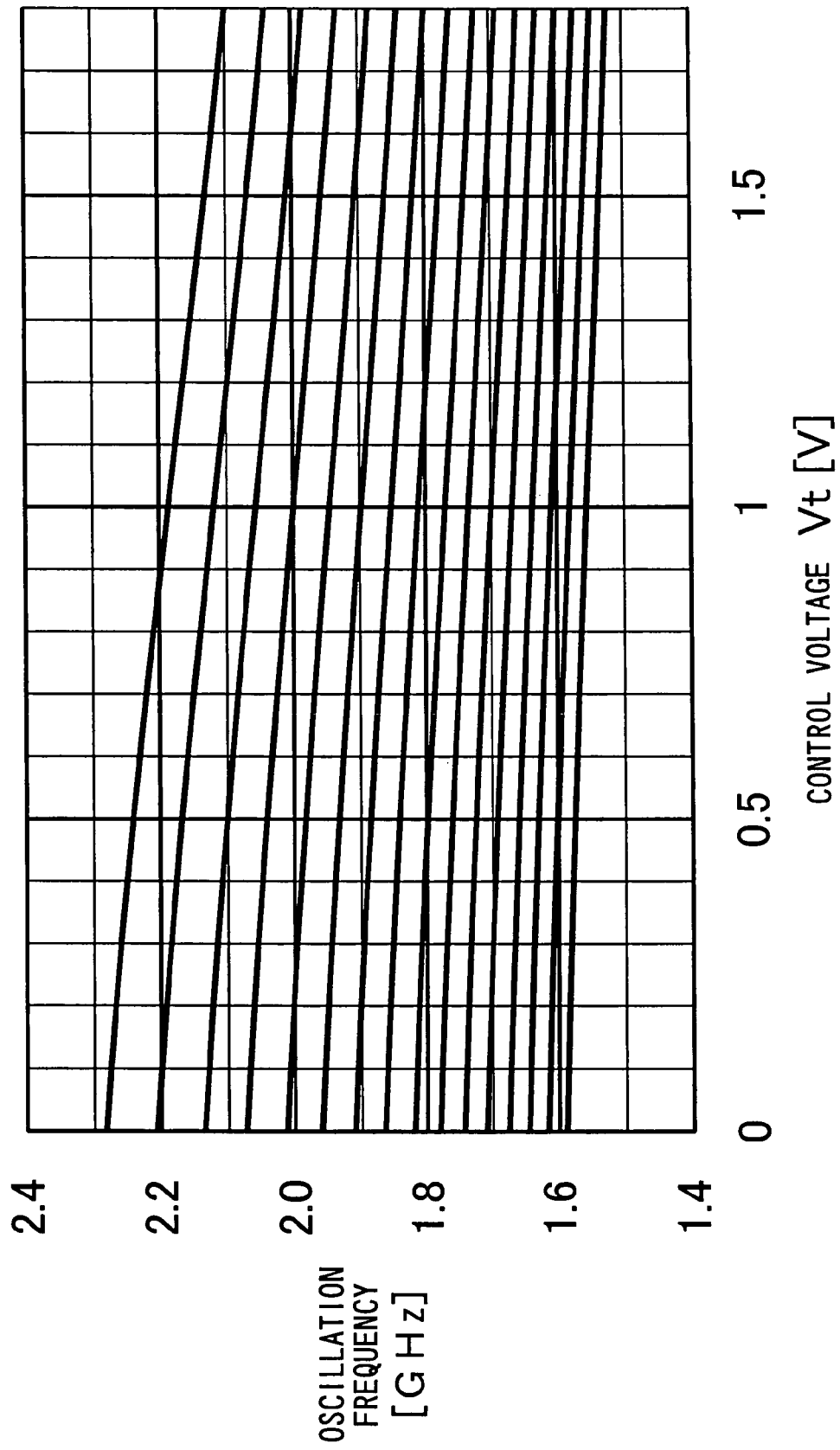
FIG. 18 is a graph showing the oscillation frequency characteristic of the conventional differential voltage control oscillator shown in FIG. 17.
Figure 19:
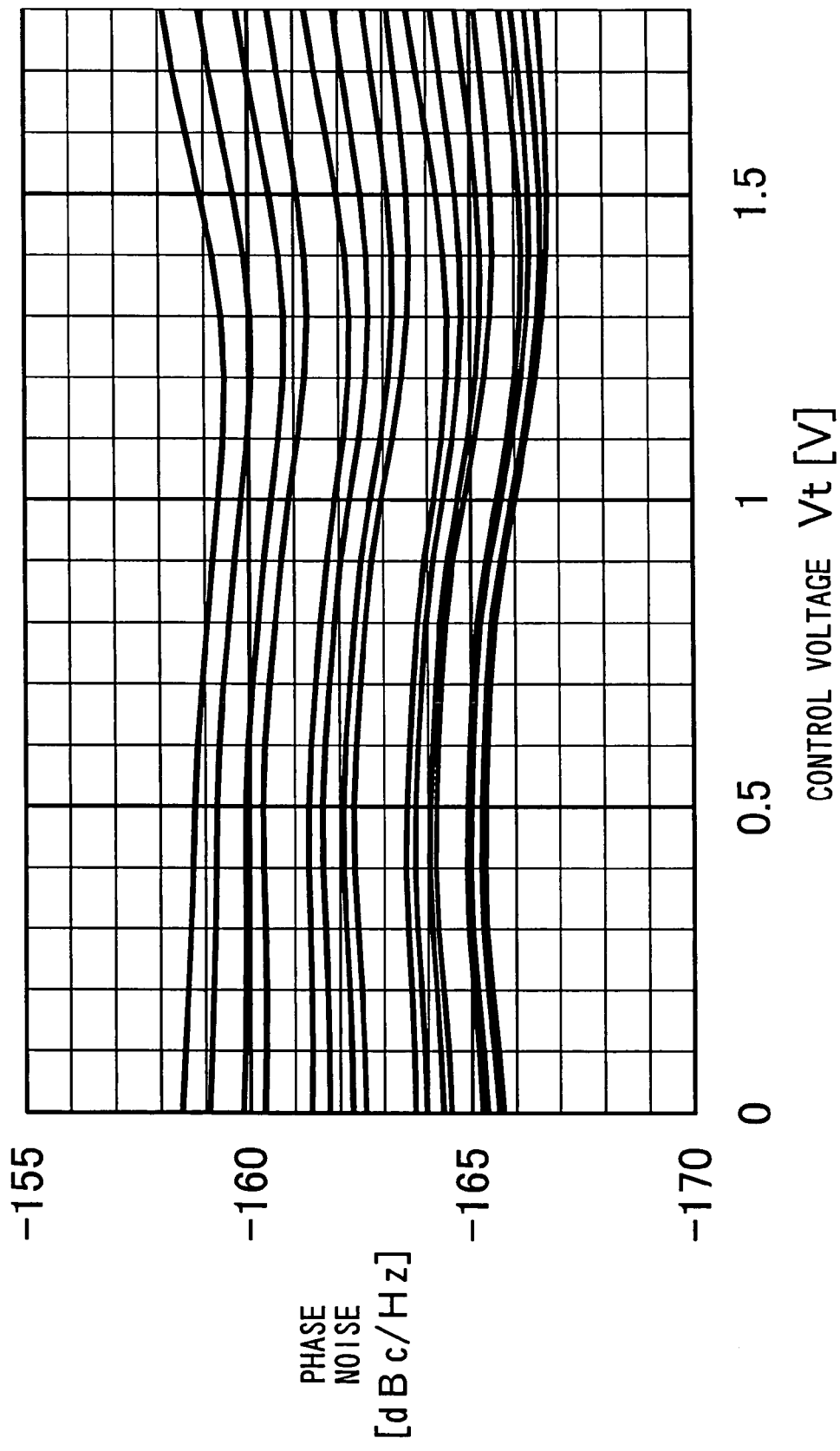
FIG. 19 is a graph showing the phase noise characteristic of the conventional differential voltage control oscillator shown in FIG. 17.
Figure 20:
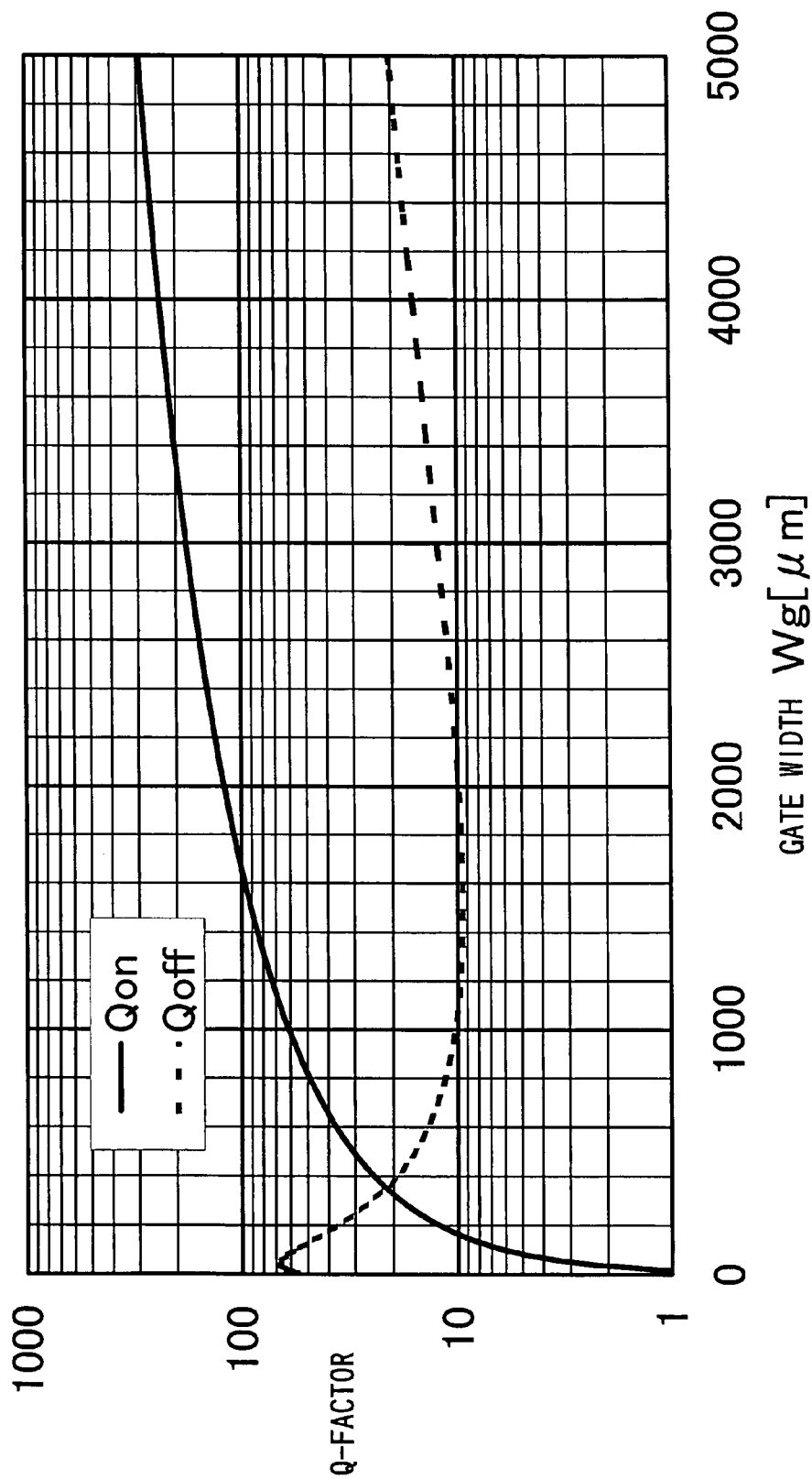
FIG. 20 is a graph showing the Q-factor of a conventional radio-frequency switching circuit.
Figure 21:
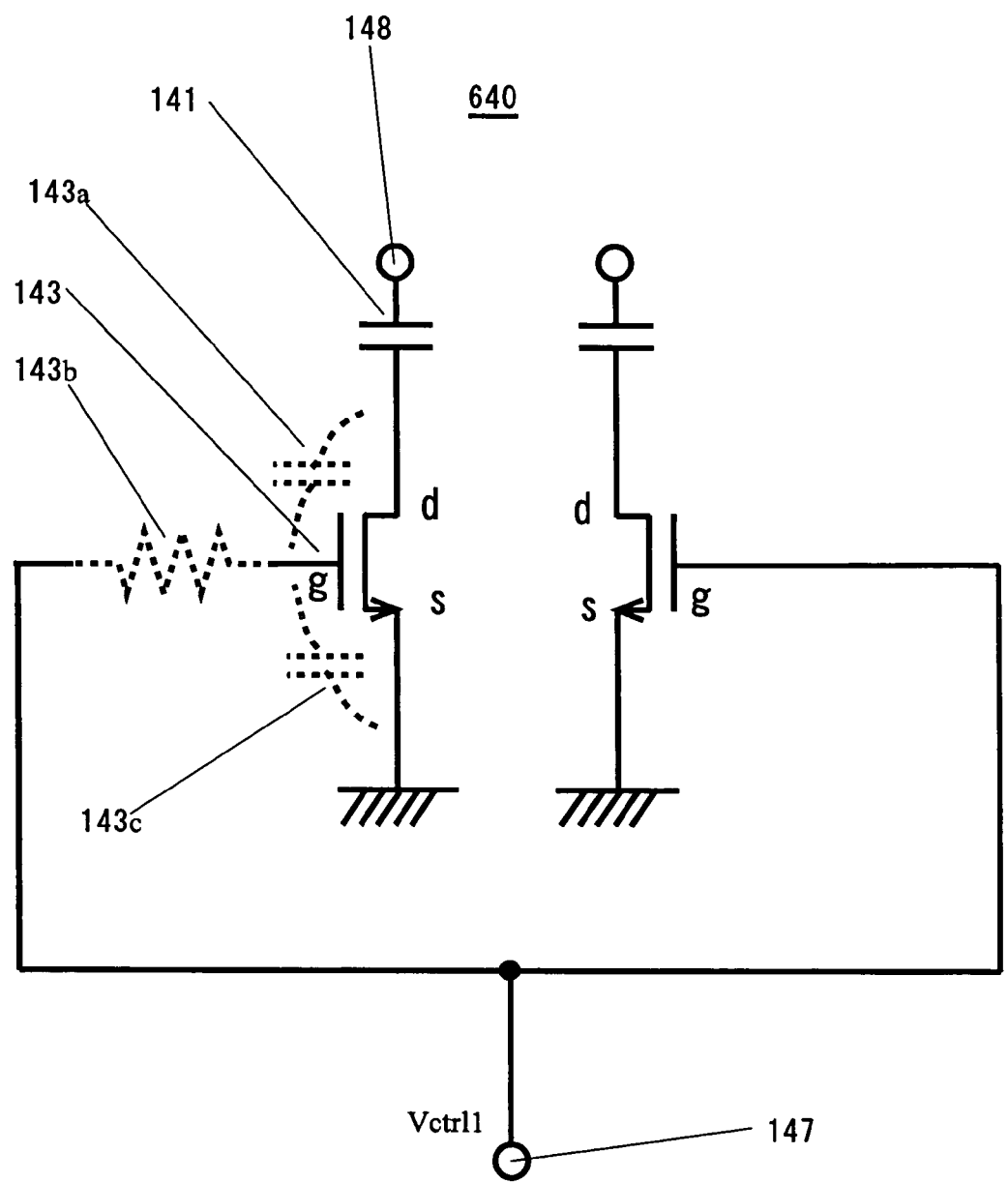
FIG. 21 is a circuit diagram used for explaining the operation of a conventional radio-frequency switching circuit.

Accordingly, the differential voltage control oscillator 200 has an oscillation frequency characteristic equivalent to that of the conventional differential voltage control oscillator 600 shown in FIG. 17.

Also, the differential voltage control oscillator 200 is configured such that in any of the first through fourth radio-frequency switching circuits 640-670, each resistive element disposed inside a virtual ground point for a differential signal functions as a radio-frequency signal reduction section. Thus, even if each switching element is in the OFF state, it is possible to reduce the amount of the radio-frequency signal that flows from gate terminals (switching control terminals) to the control voltage terminal 147.

Figure 8:
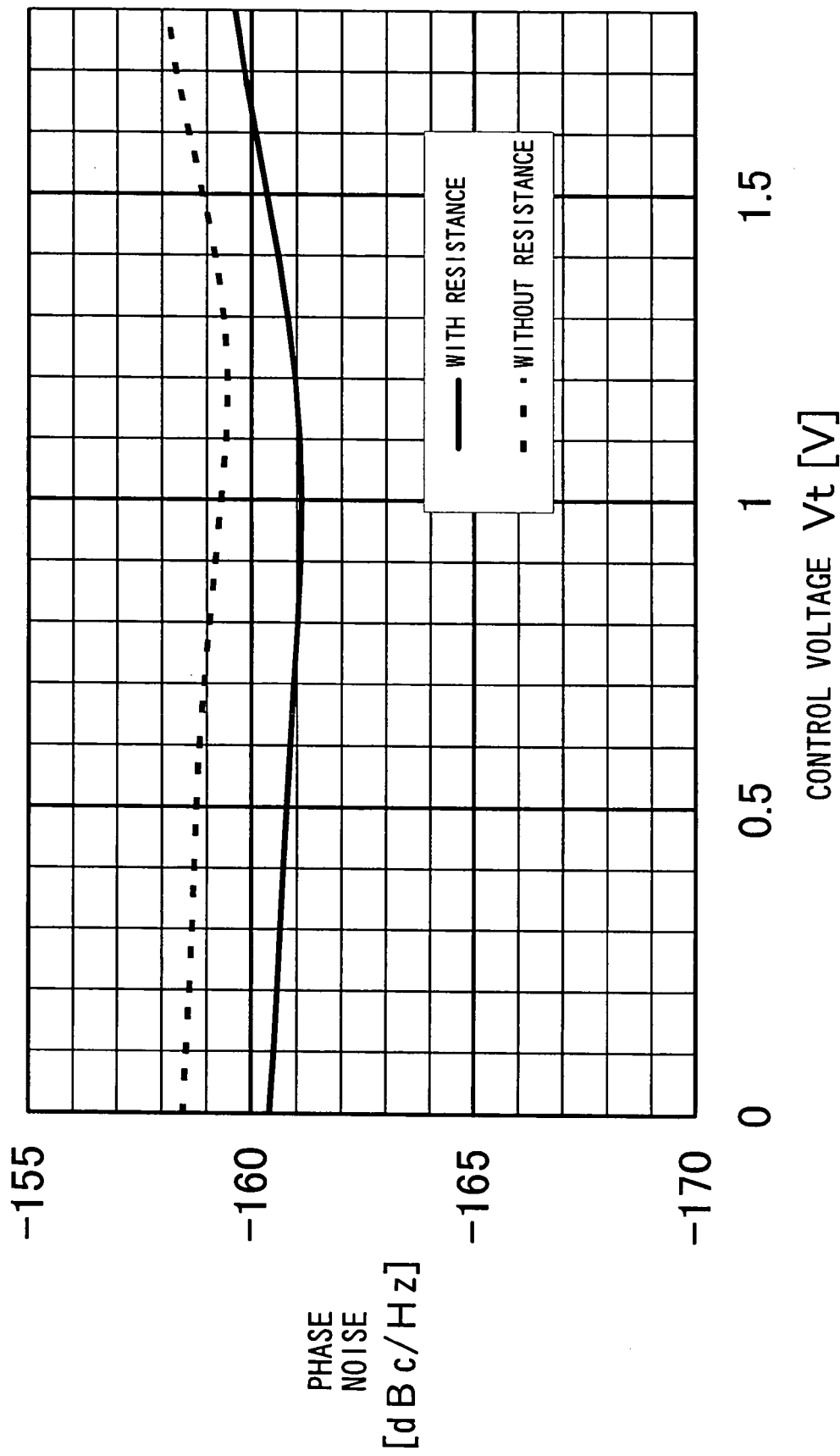
FIG. 8 is a graph showing the phase noise characteristic of a differential voltage control oscillator including a plurality of radio-frequency switching circuits according to the first embodiment.

FIG. 8 is a graph showing the phase noise characteristic of the differential voltage control oscillator 200 including a plurality of radio-frequency switching circuits according to the first embodiment. In FIG. 8, the horizontal axis denotes the control voltage Vt, and the vertical axis denotes the phase noise.

In the graph of FIG. 8, the solid curve denotes the phase noise characteristic when all switching elements of each radio-frequency switching circuit are in the OFF state, and the dotted curve denotes the phase noise characteristic when all switching elements of a circuit without having resistive elements for the purpose of comparison (the differential voltage control oscillator 600 as described in conjunction with FIG. 17) are in the OFF state.

In FIG. 8, in comparison to the case where there is no resistive element as in the conventional art (dotted curve), the phase noise characteristic of the differential voltage control oscillator 200 (solid curve) is improved by about 2 dB. This is due to that the Q-factors of the first through fourth radio-frequency switching circuits 640-670 when the switching elements are in the OFF state are improved.

Figure 9:
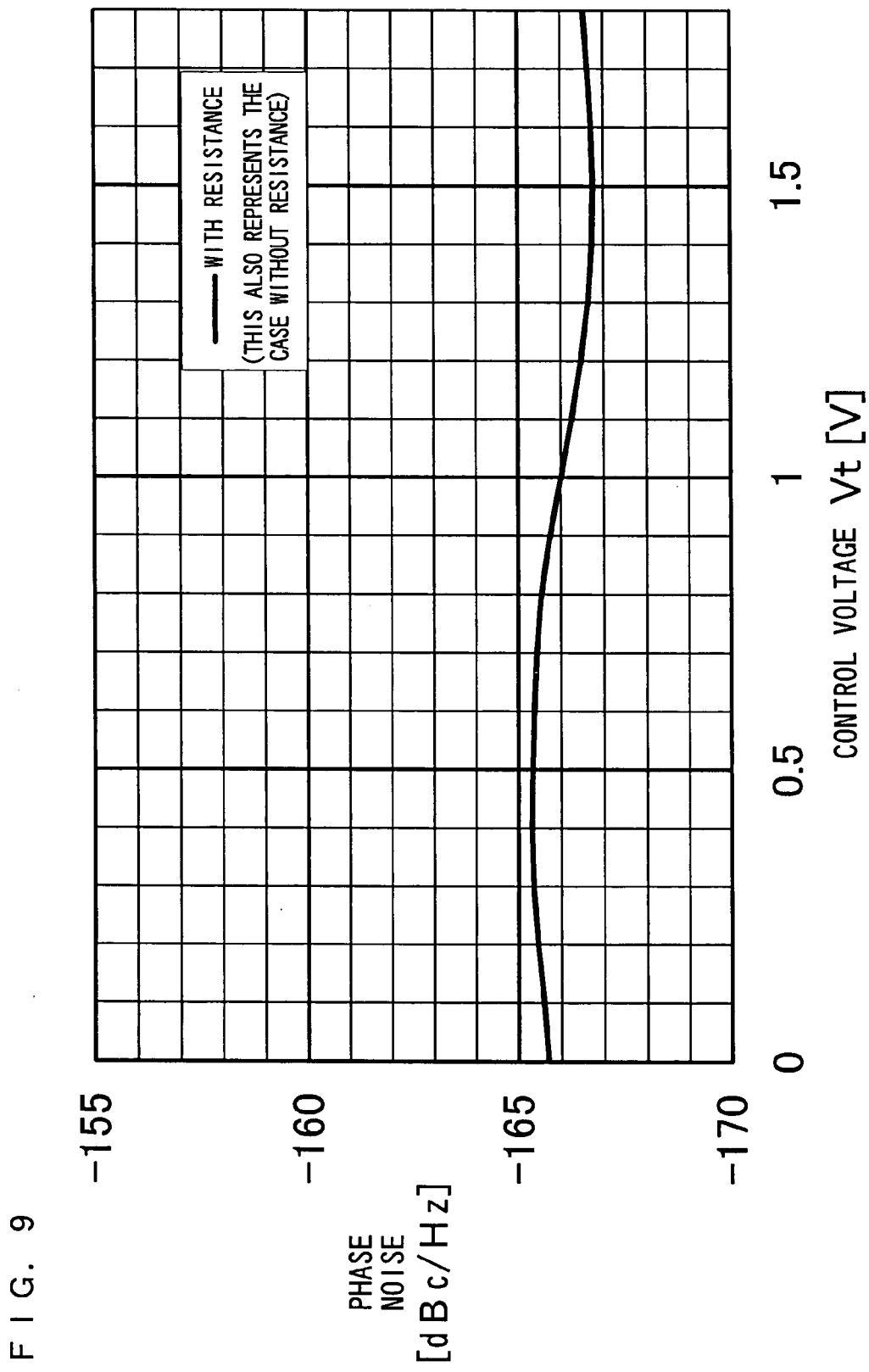
FIG. 9 is another graph showing the phase noise characteristic of a differential voltage control oscillator including a plurality of radio-frequency switching circuits according to the first embodiment.

FIG. 9 is another graph showing the phase noise characteristic of the differential voltage control oscillator 200 including a plurality of radio-frequency switching circuits according to the first embodiment. In FIG. 9, the horizontal axis denotes the control voltage Vt, and the vertical axis denotes the phase noise.

In the graph of FIG. 9, the solid curve denotes the phase noise characteristic when all switching elements of each radio-frequency switching circuit are in the ON state. The phase noise characteristic when all switching elements of a circuit without having resistive elements for the purpose of comparison (the differential voltage control oscillator 600 as described in conjunction with FIG. 17) are in the ON state substantially coincides with the solid curve shown in this graph.

In the case where the switching elements are in the ON state, the phase noise characteristic does not change depending on the presence or absence of resistive elements. Accordingly, by disposing resistive elements, the phase noise characteristic when the switching elements are in the OFF state is improved without affecting the phase noise characteristic when the switching elements are in the ON state.

Thus, in comparison to the conventional differential voltage control oscillator 600, the differential voltage control oscillator 200 including a plurality of radio-frequency switching circuits according to the first embodiment has a satisfactory phase noise characteristic when each radio-frequency switching circuit is in the OFF state. On the other hand, the differential voltage control oscillator 200 has the phase noise characteristic equivalent to that of the conventional differential voltage control oscillator 600 even when each radio-frequency switching circuit is in the ON state.

The differential voltage control oscillator 200 has a satisfactory phase noise characteristic compared to the conventional art because each radio-frequency switching circuit includes a radio-frequency signal reduction section. Also, the oscillation frequency is allowed to vary in a wide frequency range as in the conventional art.

Note that in the above example, the first through fourth radio-frequency switching circuits 640-670 differ from each other in terms of the capacitance of capacitive elements and the gate width of switching elements, but the present invention is not limited to this.

In the above example, the ratios among the first through fourth radio-frequency switching circuits 640-670 in terms of the capacitance of capacitive elements and the gate width of switching elements are set so as to be 1:2:4:8 with reference to the first radio-frequency switching circuit 140. Thus, it is possible to switch the oscillation frequency between sixteen different ranges.

Alternatively, in the case where the ratios among the first through fourth radio-frequency switching circuits 640-670 in terms of the capacitance of capacitive elements and the gate width of switching elements are set so as to be 1:1:1:1 with reference to the first radio-frequency switching circuit 140, it is possible to switch the oscillation frequency between five different ranges.

Alternatively still, in the case where the ratios among the first through fourth radio-frequency switching circuits 640-670 in terms of the capacitance of capacitive elements and the gate width of switching elements are set so as to be 1:1:2:2 with reference to the first radio-frequency switching circuit 140, it is possible to switch the oscillation frequency between seven different ranges.

Although four radio-frequency switching circuits are shown in the above example, the number of radio-frequency switching circuits is not limited to four. For example, if it is necessary to further widen the frequency variable range, five or more radio-frequency switching circuits may be used. Alternatively, three or less radio-frequency switching circuits may be used for a narrower frequency variable range.

Figure 10:
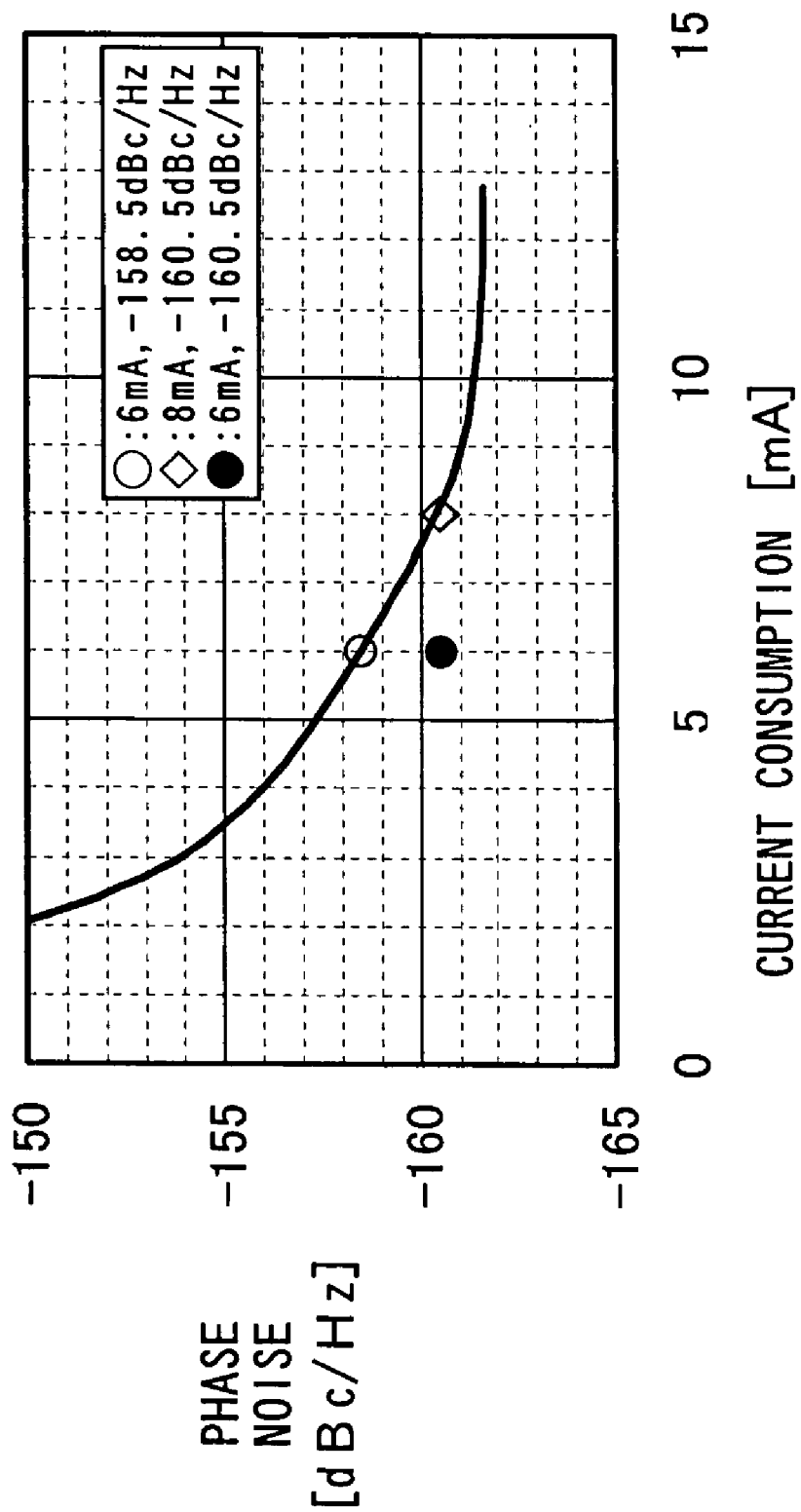
FIG. 10 is a graph showing the phase noise characteristic when the current value of a current source 103 of the conventional differential voltage control oscillator shown in FIG. 17 is changed with all switching elements being in the OFF state.

FIG. 10 is a graph showing the phase noise characteristic when the current value of the current source 103 of the conventional differential voltage control oscillator shown in FIG. 17 is changed with all switching elements being in the OFF state. In FIG. 10, the current value of the current source 103 is changed under the condition that the control voltage Vt as denoted by the dotted curve (without resistance) shown in FIG. 8 is at zero. In FIG. 10, a phase noise (−160.5 dBc/Hz) when the control voltage Vt denoted by the solid curve (with resistance) shown in FIG. 8 is at zero is plotted with a solid circle. Current consumption at the solid circle is 6 mA. In the conventional differential voltage control oscillator, if the current consumption is 6 mA, the phase noise becomes −158.5 dBc/Hz as indicated by an empty circle. In the conventional differential voltage control oscillator, in order to obtain the same phase noise as that at the solid circle, it is necessary to increase the current consumption to 8 mA as indicated by a diamond. From the foregoing, it is understood that the differential voltage control oscillator of the present invention allows the phase noise characteristic to increase with less current consumption compared to the conventional art.

Second Embodiment

Figure 11:
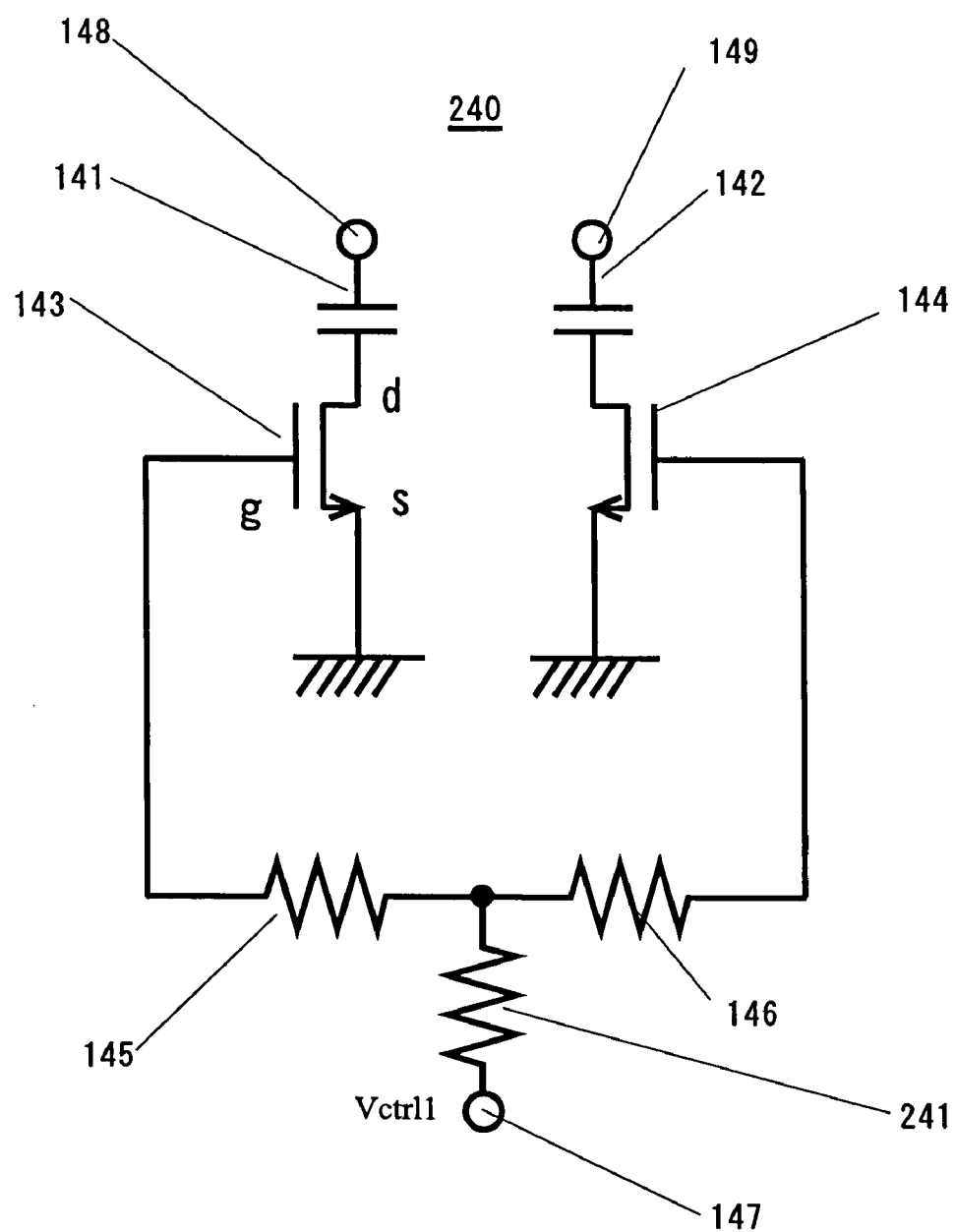
FIG. 11 is a circuit diagram illustrating a radio-frequency switching circuit according to a second embodiment of the present invention.

FIG. 11 is a circuit diagram illustrating a radio-frequency switching circuit 240 according to a second embodiment of the present invention. In FIG. 11, elements similar to those of the radio-frequency switching circuit 140 according to the first embodiment are denoted by the same reference numerals, and the descriptions thereof are omitted.

The radio-frequency switching circuit 240 according to the second embodiment is the same as the radio-frequency switching circuit 140 according to the first embodiment, except that a resistive element 241 is disposed between a connection point of the resistive elements 145 and 146 and a control voltage terminal 147. That is, the radio-frequency switching circuit 240 according to the second embodiment has an impedance element interposed between a virtual ground point and the control voltage terminal 147.

In the radio-frequency switching circuit 240, the resistive elements 145, 146, and 241 act as radio-frequency signal reduction sections. Specifically, the resistive element 241 acts as a third radio-frequency signal reduction section operable to reduce a radio-frequency signal that flows through switching elements 143 and 144 from drain (conduction terminal) to gate (switching control terminal). In the case where the differential balance is disturbed due to variation in quality among the elements or variation in temperature characteristic of the elements, the connection point of the resistive elements 145, 146, and 241 might not completely act as a virtual ground point. In such a case, the radio-frequency signal may flow to the control voltage terminal. In the second embodiment, however, the resistive element 241 acts as a radio-frequency signal reduction section, and therefore the radio-frequency signal is substantially prevented from flowing to the control voltage terminal. Accordingly, even if the switching elements 143 and 144 are in the OFF state, it is possible to improve the Q-factor of the radio-frequency switching circuit 240.

Also, in the case of applying the radio-frequency switching circuit 240, instead of the radio-frequency switching circuit 140 according to the first embodiment, to the differential voltage control oscillators 100 and 200 as described earlier herein, it is possible to reduce the amount of the radio-frequency signal that flows from the switching elements 143 and 144 to the control voltage terminal 147. Accordingly, by applying the radio-frequency switching circuit 240 to the differential voltage control oscillators 100 and 200, it is possible to obtain satisfactory phase noise characteristics of the differential voltage control oscillators.

Third Embodiment

Figure 12:
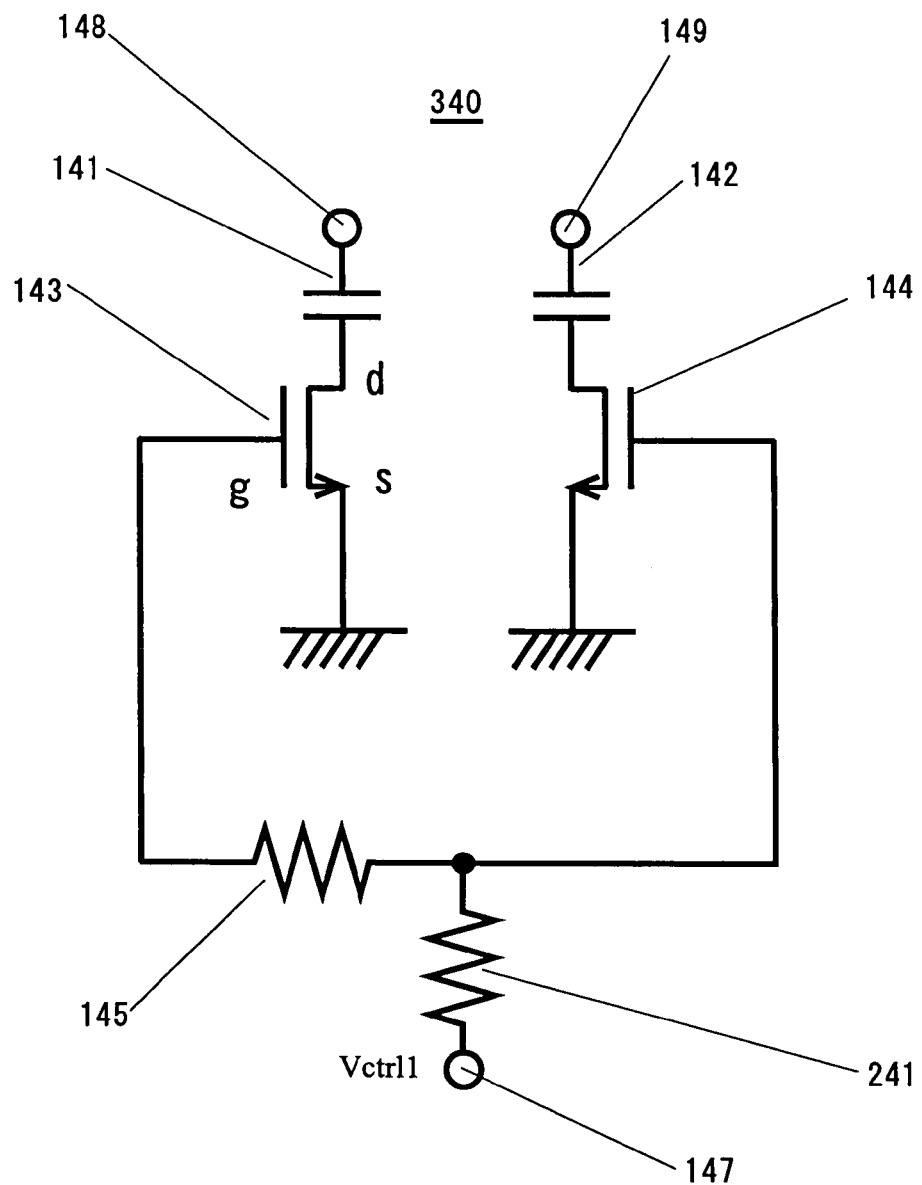
FIG. 12 is a circuit diagram illustrating a radio-frequency switching circuit according to a third embodiment of the present invention.

FIG. 12 is a circuit diagram illustrating a radio-frequency switching circuit 340 according to a third embodiment of the present invention. In FIG. 12, elements similar to those of the radio-frequency switching circuit 140 according to the first embodiment are denoted by the same reference numerals, and the descriptions thereof are omitted.

The radio-frequency switching circuit 340 according to the third embodiment is the same as the radio-frequency switching circuit 140 according to the first embodiment, except that there is no element corresponding to the resistive element 146, and a resistive element 241 is disposed between a control voltage terminal 147 and a connection point of a resistive element 145 and a switching element 144.

In the radio-frequency switching circuit 340, the resistive elements 145 and 241 act as radio-frequency signal reduction sections associated with a switching element 143. Further, the resistive element 241 acts as a fourth radio-frequency signal reduction section associated with the switching element 144. Specifically, the resistive element 241 is operable to reduce the amount of the radio-frequency signal that flows through the switching element 144 from drain (conduction terminal) to gate (switching control terminal). Accordingly, even if the switching elements 143 and 144 are in the OFF state, it is possible to improve the Q-factor of the radio-frequency switching circuit 340.

Also, in the case of applying the radio-frequency switching circuit 340, instead of the radio-frequency switching circuit 140 according to the first embodiment, to the differential voltage control oscillators 100 and 200 as described earlier herein, it is possible to reduce the amount of the radio-frequency signal that flows from the switching elements 143 and 144 to the control voltage terminal 147. Accordingly, by applying the radio-frequency switching circuit 340 to the differential voltage control oscillators 100 and 200, it is possible to obtain satisfactory phase noise characteristics of the differential voltage control oscillators.

Fourth Embodiment

The above-described first through third embodiments have illustrated examples where resistive elements are interposed as first through fourth radio-frequency signal reduction sections at predetermined locations in a circuit. However, the first through fourth radio-frequency signal reduction sections may be impedance elements such as resistive elements or inductor elements.

Figure 13:
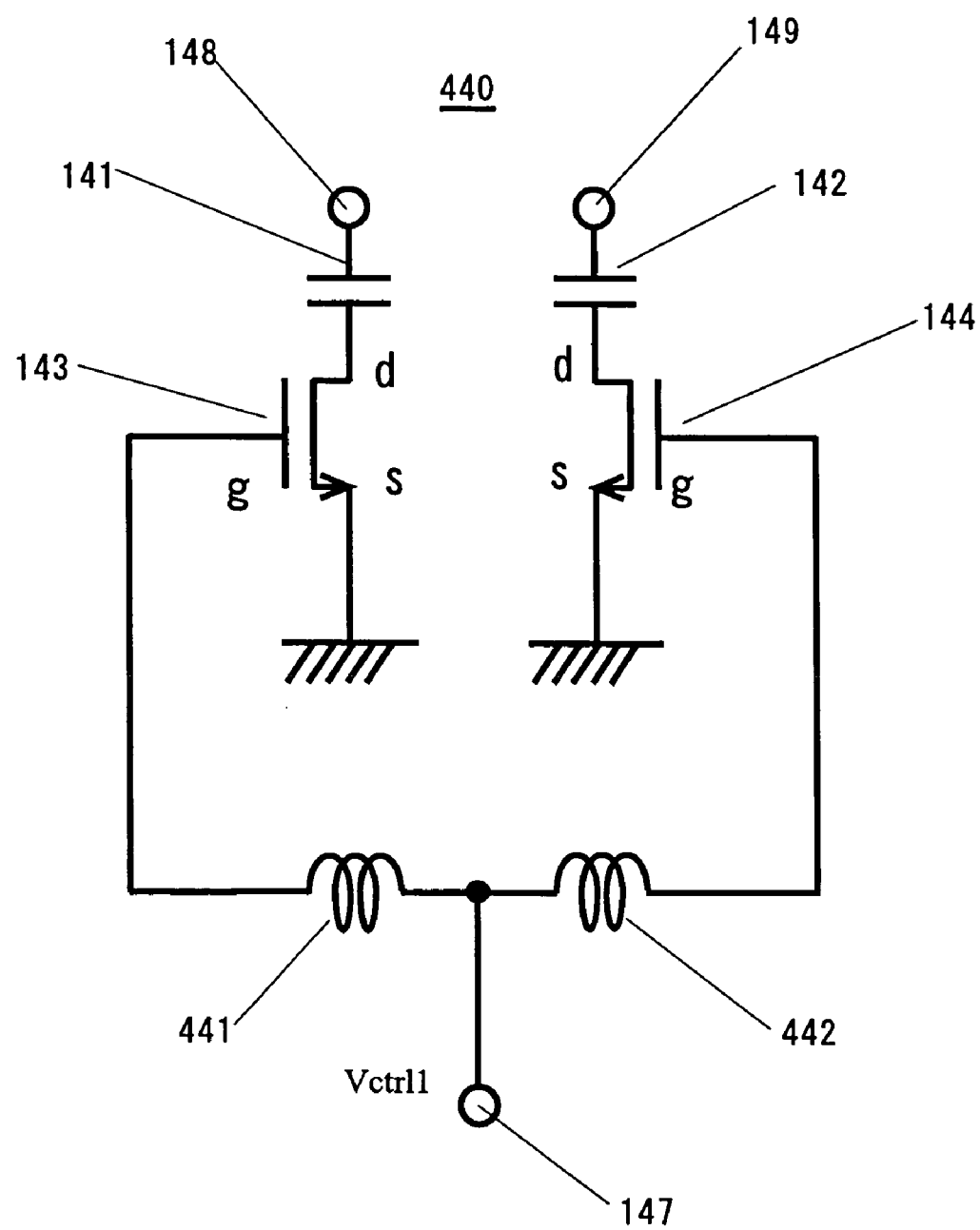
FIG. 13 is a circuit diagram illustrating a radio-frequency switching circuit according to a fourth embodiment of the present invention.

FIG. 13 is a circuit diagram illustrating a radio-frequency switching circuit 440 according to a fourth embodiment of the present invention. The radio-frequency switching circuit 440 according to the fourth embodiment is the same as the radio-frequency switching circuit 140 according to the first embodiment except that an inductor 441 is disposed in place of the resistive element 145, and an inductor 442 is disposed in place of the resistive element 146.

Both a resistive element and an inductor present a high impedance to a radio-frequency signal if their characteristic values are set at a predetermined level, and therefore circuit operations are not affected even if either the resistive element or the inductor is substituted for the other. For example, in the case of using an inductor having an inductor value which exhibits an impedance equal to that of a 1 kΩ resistor at a desired frequency, it is possible to achieve an effect equal to that achieved by using the 1 kΩ resistor. Accordingly, even if switching elements 143 and 144 are in the OFF state, it is possible to improve the Q-factor of the radio-frequency switching circuit 440.

Also, in the case of applying the radio-frequency switching circuit 440, instead of the radio-frequency switching circuit 140 according to the first embodiment, to the differential voltage control oscillators 100 and 200, it is possible to reduce the amount of a radio-frequency signal that flows from the switching elements 143 and 144 to a control voltage terminal 147. Accordingly, by applying the radio-frequency switching circuit 440 to the differential voltage control oscillators 100 and 200, it is possible to achieve satisfactory phase noise characteristics of the differential voltage control oscillators.

Similarly, in the above second and third embodiments, resistive elements disposed as radio-frequency signal reduction sections may be replaced by inductors presenting an impedance equal to an impedance presented to a radio-frequency signal by the resistive elements as described in the fourth embodiment. In this case, circuits operations to be performed are the same as those performed in the case of the resistive elements. Also, a resistive element and an inductor may be used in combination with each other.

Fifth Embodiment

The above-described first through fourth embodiments have illustrated examples where elements presenting a high impedance to a radio-frequency signal are interposed as first through fourth radio-frequency signal reduction sections at predetermined locations in a circuit. Similar effects can be achieved by changing the impedance of the circuit itself.

Specifically, in the specific IC layout illustrated in FIG. 6, the gate leads 205a and 205b are thinned to such an extent as not to affect the control voltage Vctrl1, so as to present a high impedance to a radio-frequency signal. As such, by thinning the gate leads, it becomes possible to enable the gate leads to act as inductors, making it possible to eliminate the necessity of providing any additional element. As a result, it is possible to increase productivity in fabricating ICs, while reducing fabrication cost. Also, it is possible to facilitate easy layout of the ICs. The inductors may be composed of a wire conductor other than the gate lead.

Sixth Embodiment

Figure 14:
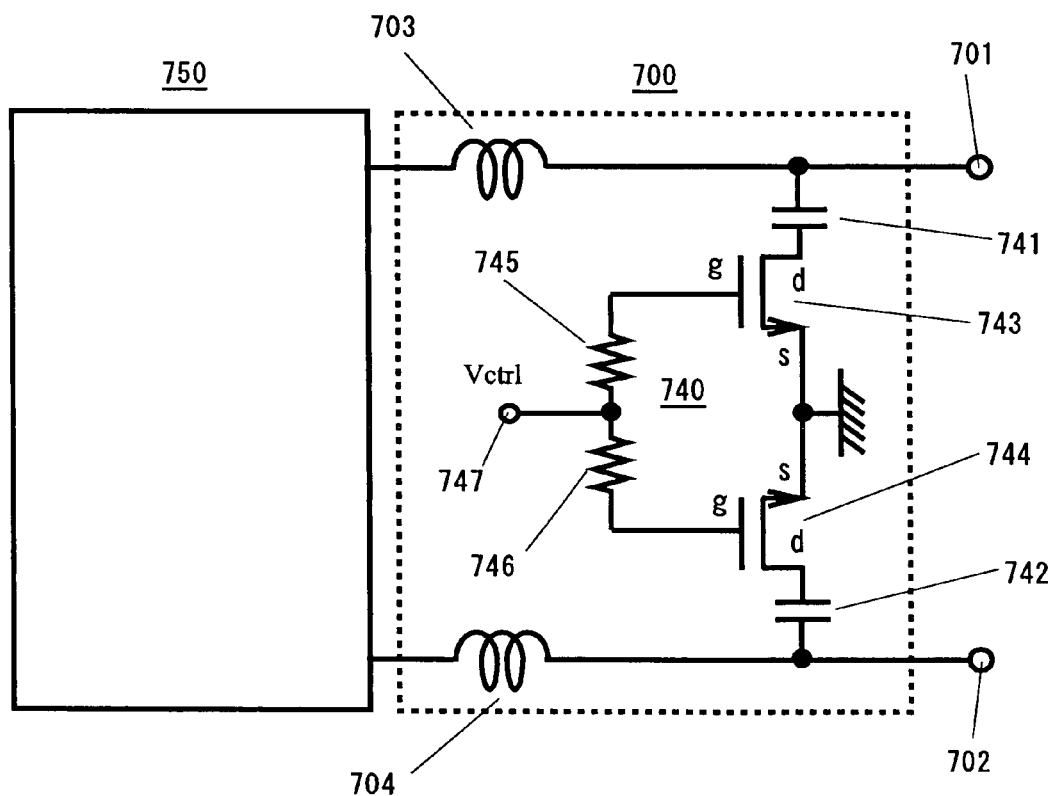
FIG. 14 is a circuit diagram illustrating a matching circuit including a radio-frequency switching circuit according to a sixth embodiment of the present invention.

FIG. 14 is a circuit diagram illustrating a matching circuit 700 including a radio-frequency switching circuit 740 according to a sixth embodiment of the present invention. The radio-frequency switching circuit 740 according to the sixth embodiment constitutes a part of the matching circuit connected to output portions of a differential radio-frequency circuit 750.

The matching circuit 700 shown in FIG. 14 is connected to the output side of the differential radio-frequency circuit 750. The differential radio-frequency circuit 750 has two output terminals connected to the matching circuit 700.

The matching circuit 700 includes an output terminal 701, an output terminal 702, an inductor 703, an inductor 704, and the radio-frequency switching circuit 740. One of the two output terminals of the differential radio-frequency circuit 750 is connected to one end of the inductor 703. The other end of the inductor 703 is connected to the output terminal 701. The other output terminal of the differential radio-frequency circuit 750 is connected to one of end of the inductor 704. The other end of the inductor 704 is connected to the output terminal 702. The inductors 703 and 704 have the same element value as each other.

The radio-frequency switching circuit 740 includes a differential series circuit pair consisting of: a differential series circuit composed of a capacitive element 741, a switching element 743, and a resistive element 745; and a differential series circuit composed of a capacitive element 742, a switching element 744, and a resistive element 746. The capacitive elements 741 and 742 have the same element value as each other. The switching element 743 and 744 have the same element value as each other. The resistive elements 745 and 746 have the same element value as each other.

The switching elements 743 and 744 are field-effect transistors each including drain d, gate g, and source s.

The capacitive elements 741 and 742 are MIM capacitance elements. The capacitive element 741 is connected at one end to the drain d (conduction terminal) of the switching element 743. The capacitive element 742 is connected at one end to the drain d (conduction terminal) of the switching element 744. The capacitive element 741 is connected at the other end between the inductor 703 and the output terminal 701. The capacitive element 742 is connected at the other end between the inductor 704 and the output terminal 702.

The gate g (switching control terminal) of the switching element 743 is connected to one end of the resistive element 745. The gate g (switching control terminal) of the switching element 744 is connected to one end of the resistive element 746. The sources s of the switching elements 743 and 744 are grounded.

The resistive element 745 is connected at the other end to an end of the resistive element 746 that is opposite to the end connected to the switching element 744. The two series circuits in the differential series circuit pair are connected together at a connection point at which the resistive elements 745 and 746 are connected with each other.

A control voltage terminal 747 is connected to the connection point of the resistive elements 745 and 746 which is a virtual ground point for a differential signal in the matching circuit 700. Through the control voltage terminal 747, control voltage Vctrl to the switching elements 743 and 744.

With the above configuration, a radio-frequency signal outputted from the differential radio-frequency circuit 750 is optimized by load impedances of the matching circuit 700, and outputted from the output terminals 701 and 702. Thus, it is possible to achieve matching with another circuit connected to the output side of the differential radio-frequency circuit 750.

The load impedances of the matching circuit 700 are determined by the inductors 703 and 704 and the capacitive elements 741 and 742.

In the case where the radio-frequency switching circuit 740 is in the ON state, the switching elements 743 and 744 become active and therefore conductive. Accordingly, the load impedances are respectively determined by a set of the inductor 703 and the capacitive element 741 and a set of the inductor 704 and the capacitive element 742.

In the case where the radio-frequency switching circuit 740 is in the OFF state, power to the switching elements 743 and 744 is shut off. Accordingly, the load impedances are determined by the inductors 703 and 704.

As such, the matching circuit 700 allow the load impedance to vary, and therefore it is possible to provide matching for a wide range of frequencies.

Also, the resistive element 745 is connected between the control voltage terminal 747 and the gate g (switching control terminal) of the switching element 743, and the resistive element 746 is connected between the control voltage terminal 747 and the gate g (switching control terminal) of the switching element 744. Also, the gates g of the switching elements 743 and 744 are connected to the resistive elements 745 and 746, respectively. Accordingly, the impedance presented at the control voltage terminal 747 is higher than the impedances presented at the gate terminals (switching control terminals) of the switching elements 743 and 744, and therefore radio-frequency signals are substantially isolated between the gate terminals (switching control terminals) of the switching elements 743 and 744.

Accordingly, in the case where the switching elements 743 and 744 are in the OFF state, as described in the example of the differential voltage control oscillator 100, a radio-frequency signal derived from the output side of the differential radio-frequency circuit 750 substantially does not flow from the gates g of the switching elements 743 and 744 to the control voltage terminal 747, and therefore does not experience losses due to gate resistances. Accordingly, the Q-factor of the radio-frequency switching circuit 740 in the OFF state is not degraded.

As described above, in the case of using a radio-frequency switching circuit of the present invention as a portion of a matching circuit, the resistive element 745 is provided as a first radio-frequency signal reduction section disposed between the switching element 743 and the control terminal 747, and the resistive element 746 is provided as a second radio-frequency signal reduction section disposed between the switching element 744 and the control voltage terminal 747. Accordingly, the Q-factor when switching elements are in the OFF state is satisfactorily maintained, and therefore it is possible to achieve a low-loss matching circuit.

Although the sixth embodiment has illustrated an exemplary matching circuit on the output side of a differential radio-frequency circuit, a radio-frequency switching circuit of the present invention maybe used in an input-side matching circuit. Also, the circuit configuration of the matching circuit is not limited to the circuit configuration as described in the sixth embodiment. For example, capacitive elements may be used instead of inductors. Alternatively, the capacitive elements or the inductors may be connected in parallel with the radio-frequency switching circuit 740.

Further, the matching circuit may include a radio-frequency switching circuit as described in the second through fifth embodiments.

In the above first through sixth embodiments, internal elements included in a differential pair have the same element value as each other. However, the scope of the present invention encompasses the use of internal elements having element values that are not completely the same as each other. Even if the differential balance is disturbed due to the element values that are not completely the same as each other, the provision of radio-frequency signal reduction sections makes it possible to reduce the amount of a radio-frequency signal that flows from conductive terminals of switching elements to a switching control terminal, thereby improving the phase noise characteristic.

Other Embodiments

In the radio-frequency switching circuits according to the above-described embodiments, capacitive elements are metal-insulator-metal (MIM) capacitance elements, but the present invention is not limited to this. For example, metal-oxide-semiconductor (MOS) capacitance elements can be used as the capacitive elements.

Also, as illustrated in the foregoing, the transistors 131 and 132 included in the negative resistance circuit 130 are nMOS-type transistors, but pMOS-type transistors may be used. In such a case, for example, connected between the inductors 111 and 112 may be a ground, rather than the power terminal 101, and the terminal of the current source 103 that is not connected to the sources of the transistors 131 and 132 may be connected to the power terminal 101, rather than a ground.

Also, as illustrated in the foregoing, the transistors 131 and 132 included in the negative resistance circuit 130 are MOS transistors, but bipolar transistors may be used.

Also, the above first through fifth embodiments have illustrated examples where a radio-frequency switching circuit and a differential voltage control oscillator are used in a frequency band between 800 MHz and 5 GHz where mobile telephones operate under the global system for mobile communications (GSM) technology or the personal digital cellular (PDC) technology, but the present invention is not limited to this. The radio-frequency switching circuit and the differential voltage control oscillator can be used in a millimeter-wave frequency band of 30 GHz or more.

Also, the radio-frequency switching circuit and the differential voltage control oscillator can be used in a hookup device for use in a wireless local area network (LAN) system which substantially operates in the frequency band between 800 MHz and 5 GHz.

Also, the above embodiments have illustrated examples where switching elements are field-effect transistors, but the present invention is not limited to this. Any switching elements can be used so long as effects similar to those achieved by the field-effect transistors can be achieved. In this case, the switching elements have switching control terminals for controlling ON/OFF of the switching elements, and conduction terminals in which to input/output a signal to/from the switching elements.

Figure 15:
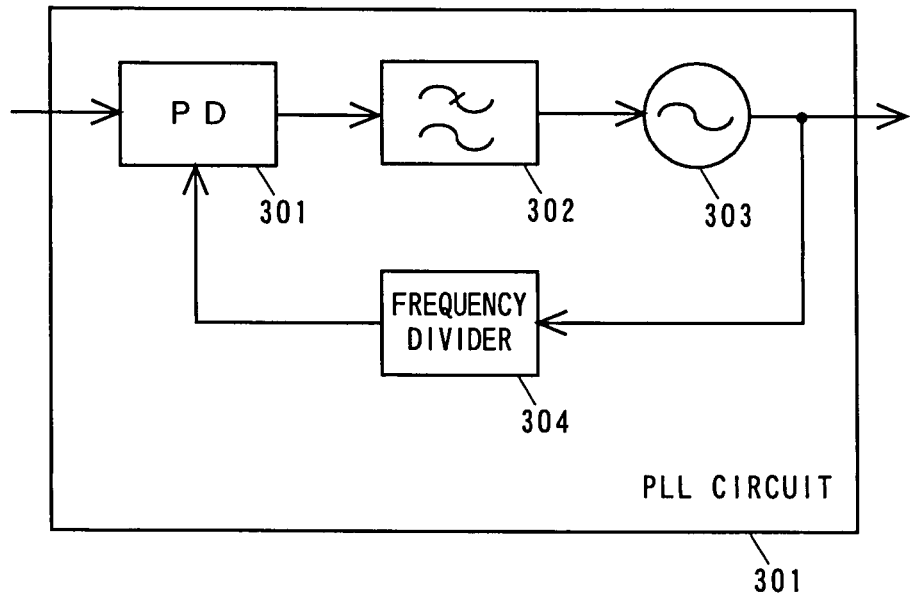
FIG. 15 is a block diagram illustrating the functional configuration of a PLL circuit 300 including a differential voltage control oscillator of the present invention.

FIG. 15 is a block diagram illustrating the functional configuration of a PLL circuit 300 including a differential voltage control oscillator of the present invention. The differential voltage control oscillator is mainly for use in a PLL circuit as shown in FIG. 15. In FIG. 15, the PLL circuit 300 includes a phase comparator 301, a loop filter 302, a differential voltage control oscillator 303, and a frequency divider 304. The PLL circuit as described herein is circuit for locking the oscillation frequency at a desired level. The differential voltage control oscillator 303 operates in a manner as described in the above first through sixth embodiments. The phase comparator 301 is operable to compare the phase of an input reference signal with phases of signals obtained by the frequency divider 304 dividing an output signal derived from the differential voltage control oscillator 303. The phase comparator 301 outputs a signal which is inputted to the loop filter 302. The loop filter 302 converts the signal outputted from the phase comparator 301 into direct current components which are inputted to the differential voltage control oscillator 303. The loop filter 302 outputs a signal containing the direct current components which is inputted, as control voltage Vt, to a control voltage terminal 102 of the differential voltage control oscillator 303. In this manner, a signal at a desired frequency level is outputted from the differential voltage control oscillator 303. Thus, the PLL circuit achieves a satisfactory phase noise characteristic.

Figure 16:
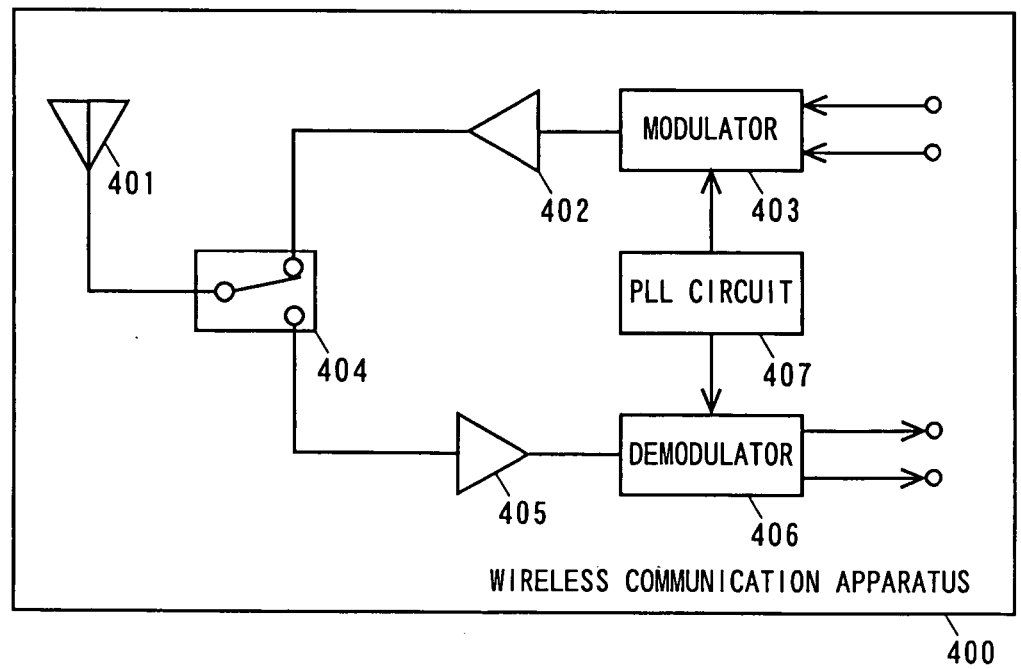
FIG. 16 is a block diagram illustrating the functional configuration of a wireless communication apparatus 400 including a differential voltage control oscillator of the present invention.

FIG. 16 is a block diagram illustrating the functional configuration of a wireless communication apparatus 400 including a differential voltage control oscillator of the present invention. In FIG. 16, the wireless communication apparatus 400 includes an antenna 401, a power amplifier 402, a modulator 403, a switch 404, a low-noise amplifier 405, a demodulator 406, and a PLL circuit 407. When the wireless communication apparatus 400 transmits a radio signal, the modulator 403 modulates a desired radio-frequency signal outputted from the PLL circuit 407 with a base band modulated signal, and outputs a radio-frequency modulated signal. The radio-frequency modulated signal outputted from the modulator 403 is amplified by the power amplifier 402, and emitted from the antenna 401 via the switch 404. In the case of receiving a radio signal, a radio-frequency modulated signal is received by the antenna 401 and inputted through the switch 404 to the low-noise amplifier 405. The radio-frequency modulated signal is amplified by the low-noise amplifier 405 and inputted to the demodulator 406. The demodulator 406 demodulates the inputted radio-frequency modulated signal with a radio-frequency signal outputted from the PLL circuit 407 to generate a baseband modulated signal. The PLL circuit 407 is a PLL circuit as shown in FIG. 15 which includes a differential voltage control oscillator of the present invention. Thus, the wireless communication apparatus achieves a satisfactory noise characteristic.

According to the present invention, it is possible to improve the performance of wireless communication apparatus such as mobile telephones and wireless LAN devices.

While the invention has been described in detail, the foregoing description is in all aspects illustrative and not restrictive. It is understood that numerous other modifications and variations can be devised without departing from the scope of the invention.

What is claimed is:

1. A differential voltage control oscillator for oscillating a radio-frequency signal, comprising:
   a parallel resonance circuit in which an inductor circuit, a variable capacitance circuit, and a radio-frequency switching circuit are connected in parallel together; and
   a negative resistance circuit connected in parallel with the parallel resonance circuit,
   wherein the radio-frequency switching circuit includes:
   a first switching element which is switched in accordance with a control voltage applied to a first switching control terminal;
   a first capacitive element connected to the first switching element;
   a second switching element which is switched in accordance with a control voltage applied to a second switching control terminal;
   a second capacitive element connected to the second switching element;
   a control voltage terminal for supplying a common control voltage to the first and second switching control terminals, the control voltage terminal being connected to a virtual ground point for a differential signal generated in the parallel resonance circuit;
   a first radio-frequency signal reduction section for reducing a radio-frequency signal that flows from a conduction terminal of the first switching element to the first switching control terminal, the first radio-frequency signal reduction section being connected between the control voltage terminal and the first switching element; and a second radio-frequency signal reduction section for reducing a radio-frequency signal that flows from a conduction terminal of the second switching element to the second switching control terminal, the second radio-frequency signal reduction section being connected between the control voltage terminal and the second switching element.

2. The differential voltage control oscillator according to claim 1, wherein the first radio-frequency signal reduction section acts as a first impedance element for presenting a desired impedance to the radio-frequency signal that flows from the conduction terminal of the first switching element to the first switching control terminal, and the second radio-frequency signal reduction section acts as a second impedance element for presenting a desired impedance to the radio-frequency signal that flows from the conduction terminal of the second switching element to the second switching control terminal.

3. The differential voltage control oscillator according to claim 2, wherein the radio-frequency switching circuit further includes a third radio-frequency signal reduction section for reducing the radio-frequency signal that flows from the conduction terminal of the first switching element to the first switching control terminal and the radio-frequency signal that flows from the conduction terminal of the second switching element to the second switching control terminal, the third radio-frequency signal reduction section being connected between the virtual ground point and the control voltage terminal.

4. The differential voltage control oscillator according to claim 2, wherein the first and second impedance elements present impedances such that a Q-factor when the first and second switching elements are off becomes substantially equivalent to a Q-factor when the first and second switching elements are on.

5. The differential voltage control oscillator according to claim 2, wherein at least one of the first and second impedance elements is a resistive element.

6. The differential voltage control oscillator according to claim 2, wherein at least one of the first and second impedance elements is an inductor.

7. The differential voltage control oscillator according to claim 6, wherein the inductor is a wire conductor.

8. The differential voltage control oscillator according to claim 3, wherein the third radio-frequency signal reduction section acts as a third impedance element.

9. The differential voltage control oscillator according to claim 8, wherein the third impedance element is a resistive element or an inductor.

10. The differential voltage control oscillator according to claim 1, further comprising at least one additional radio-frequency switching circuit having a same relationship as the radio-frequency switching circuit with respect to an internal element connection, the at least one additional radio-frequency switching circuit being connected in parallel with the parallel resonance circuit and the negative resistance circuit.

11. The differential voltage control oscillator according to claim 10, wherein one of the radio-frequency switching circuit and the at least one radio-frequency switching circuit has a capacitance value different from that of any other radio-frequency switching circuit in the differential voltage control oscillator.

12. The differential voltage control oscillator according to claim 1, wherein the first and second switching elements are field-effect transistors.

13. The differential voltage control oscillator according to claim 12, wherein the field-effect transistors have a ring structure in which a gate electrode surrounds a drain electrode.

14. The differential voltage control oscillator according to claim 12, wherein the first and second switching elements are field-effect transistors laid out on an IC chip so as to form a comb-like configuration in which portions of the field-effect transistors alternate with each other.

15. The differential voltage control oscillator according to claim 14, wherein the field-effect transistors have a gate with a lead located on a top layer of the IC chip.

16. The differential voltage control oscillator according to claim 14, wherein the first and second radio-frequency signal reduction sections are disposed close to the lead of the gate of a corresponding one of the field-effect transistors.

17. The differential voltage control oscillator according to claim 1, wherein the first and second capacitive elements are metal-insulator-metal capacitance elements.

18. The differential voltage control oscillator according to claim 1, wherein the first and second capacitive elements are metal-oxide-semiconductor capacitance elements.

19. A matching circuit connected to a differential radio-frequency circuit which provides matching between the differential radio-frequency circuit and a further circuit connected to the differential radio-frequency circuit, the matching circuit comprising a radio-frequency switching circuit connected in parallel between the differential radio-frequency circuit and the further circuit, wherein the radio-frequency switching circuit allows a load impedance to a radio-frequency signal, which flows between the differential radio-frequency circuit and the further circuit, to become variable, the radio-frequency switching circuit including:

a first switching element which is switched in accordance with a control voltage applied to a first switching control terminal;

a first capacitive element connected to the first switching element;

a second switching element which is switched in accordance with a control voltage applied to a second switching control terminal;

a second capacitive element connected to the second switching element;

a control voltage terminal for supplying a common control voltage to the first and second switching control terminals, the control voltage terminal being connected to a virtual ground point for a differential signal in the matching circuit;

a first radio-frequency signal reduction section for reducing a radio-frequency signal that flows from a conduction terminal of the first switching element to the first switching control terminal, the first radio-frequency signal reduction section being connected between the control voltage terminal and the first switching element; and a second radio-frequency signal reduction section for reducing a radio-frequency signal that flows from a conduction terminal of the second switching element to the second switching control terminal, the second radio-frequency signal reduction section being connected between the control voltage terminal and the second switching element.

20. A phase-locked loop circuit including a differential voltage control oscillator, wherein the differential voltage control oscillator includes:
- a parallel resonance circuit in which an inductor circuit, a variable capacitance circuit, and a radio-frequency switching circuit are connected in parallel together; and
- a negative resistance circuit connected in parallel with the parallel resonance circuit, and the radio-frequency switching circuit includes:
- a first switching element which is switched in accordance with a control voltage applied to a first switching control terminal;
- a first capacitive element connected to the first switching element;
- a second switching element which is switched in accordance with a control voltage applied to a second switching control terminal;
- a second capacitive element connected to the second switching element;
- a control voltage terminal for supplying a common control voltage to the first and second switching control terminals, the control voltage terminal being connected to a virtual ground point for a differential signal generated in the parallel resonance circuit;
- a first radio-frequency signal reduction section for reducing a radio-frequency signal that flows from a conduction terminal of the first switching element to the first switching control terminal, the first radio-frequency signal reduction section being connected between the control voltage terminal and the first switching element; and
- a second radio-frequency signal reduction section for reducing a radio-frequency signal that flows from a conduction terminal of the second switching element to the second switching control terminal, the second radio-frequency signal reduction section being connected between the control voltage terminal and the second switching element.

21. A wireless communication apparatus including a differential voltage control oscillator, wherein the differential voltage control oscillator includes:
- a parallel resonance circuit in which an inductor circuit, a variable capacitance circuit, and a radio-frequency switching circuit are connected in parallel together; and
- a negative resistance circuit connected in parallel with the parallel resonance circuit, and the radio-frequency switching circuit includes:
- a first switching element which is switched in accordance with a control voltage applied to a first switching control terminal;
- a first capacitive element connected to the first switching element;
- a second switching element which is switched in accordance with a control voltage applied to a second switching control terminal;
- a second capacitive element connected to the second switching element;
- a control voltage terminal for supplying a common control voltage to the first and second switching control terminals, the control voltage terminal being connected to a virtual ground point for a differential signal generated in the parallel resonance circuit;
- a first radio-frequency signal reduction section for reducing a radio-frequency signal that flows from a conduction terminal of the first switching element to the first switching control terminal, the first radio-frequency signal reduction section being connected between the control voltage terminal and the first switching element; and
- a second radio-frequency signal reduction section for reducing a radio-frequency signal that flows from a conduction terminal of the second switching element to the second switching control terminal, the second radio-frequency signal reduction section being connected between the control voltage terminal and the second switching element.

* * * * *